(12) United States Patent
Kanomata et al.

(10) Patent No.: US 12,051,979 B2
(45) Date of Patent: Jul. 30, 2024

(54) SUBSTRATE ELECTRIC POTENTIAL STABILIZATION CIRCUIT AND BIDIRECTIONAL SWITCH SYSTEM

(71) Applicant: Panasonic Intellectual Property Management Co., Ltd., Osaka (JP)

(72) Inventors: Ryusuke Kanomata, Osaka (JP); Yusuke Kinoshita, Kyoto (JP); Hidetoshi Ishida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 278 days.

(21) Appl. No.: 17/755,574

(22) PCT Filed: Jan. 5, 2021

(86) PCT No.: PCT/JP2021/000114
§ 371 (c)(1),
(2) Date: May 2, 2022

(87) PCT Pub. No.: WO2021/153170
PCT Pub. Date: Aug. 5, 2021

(65) Prior Publication Data
US 2022/0385196 A1    Dec. 1, 2022

(30) Foreign Application Priority Data
Jan. 27, 2020  (JP) .................................. 2020-011239

(51) Int. Cl.
H02M 1/08    (2006.01)
H02M 1/00    (2006.01)
(Continued)

(52) U.S. Cl.
CPC ..... *H02M 3/33584* (2013.01); *H02M 1/0058* (2021.05); *H01L 27/0629* (2013.01); *H02M 1/08* (2013.01); *H02M 3/155* (2013.01)

(58) Field of Classification Search
CPC ...... H02M 1/08; H02M 3/155; H01L 27/0629
See application file for complete search history.

(56) References Cited

U.S. PATENT DOCUMENTS 5,689,209 A    11/1997  Williams et al.
2005/0225373 A1*  10/2005  Morita ............... H03K 17/6871
                                                        327/377
(Continued)

FOREIGN PATENT DOCUMENTS

JP    8-275406        10/1996
JP    2018-117110     7/2018
WO   2011/064955      6/2011

OTHER PUBLICATIONS

International Search Report of PCT application No. PCT/JP2021/000114 dated Apr. 6, 2021.

*Primary Examiner* — Gary A Nash
(74) *Attorney, Agent, or Firm* — Rimon P.C.

(57) ABSTRACT

A substrate electric potential stabilization circuit is configured to be connected to a bidirectional switch element including a first main electrode, a second main electrode, and a backside electrode. The stabilization circuit includes a first switch connected to the first main electrode and the backside electrode in series between the first main electrode and the backside electrode, a second switch connected to the second main electrode and the backside electrode in series between the second main electrode and the backside electrode, and a through-current prevention circuit configured to prevent the first switch and the second switch from being (Continued)

turned on simultaneously. The substrate electric potential stabilization circuit prevents a through-current flowing in this circuit.

13 Claims, 17 Drawing Sheets

(51) Int. Cl.
*H02M 3/155* (2006.01)
*H02M 3/335* (2006.01)
*H01L 27/06* (2006.01)

(56) References Cited

U.S. PATENT DOCUMENTS

| | | |
|---|---|---|
| 2012/0217542 A1 | 8/2012 | Morita |
| 2017/0357283 A1* | 12/2017 | Adachi .................. G05F 3/205 |
| 2019/0006499 A1* | 1/2019 | Kinoshita ............. H01L 29/778 |

* cited by examiner

SUBSTRATE ELECTRIC POTENTIAL STABILIZATION CIRCUIT AND BIDIRECTIONAL SWITCH SYSTEM

TECHNICAL FIELD

The present disclosure relates to a substrate electric potential stabilization circuit including a semiconductor element, and to a bidirectional switch system.

BACKGROUND ART

PTL 1 discloses a conventional bidirectional semiconductor switching device. A substrate voltage control circuit includes a first connection terminal, a second connection terminal, and a substrate voltage control terminal. This substrate voltage control circuit further includes a first switch with a first source connected to the substrate voltage control terminal, a first drain connected to the first connection terminal, and a first gate, and a first resistor connected between the first gate and the second connection terminal. This substrate voltage control circuit further includes a second switch with a second source connected to the substrate voltage control terminal, a second drain connected to the second connection terminal, and a second gate, and a second resistor connected between the second gate and the first connection terminal.

In the substrate voltage control circuit disclosed of PTL 1, a substrate potential is equal to a potential of a source on a low-potential side of two sources. Thus, the bidirectional switching device may operate to reduce a difference between switching characteristics in two current directions while operating with stable switching characteristics.

CITATION LIST

Patent Literature

PTL 1: Japanese Patent Laid-Open Publication No. 2018-117110

SUMMARY

A substrate electric potential stabilization circuit is configured to be connected to a bidirectional switch element including a first main electrode, a second main electrode, and a backside electrode. The stabilization circuit includes a first switch connected to the first main electrode and the backside electrode in series between the first main electrode and the backside electrode, a second switch connected to the second main electrode and the backside electrode in series between the second main electrode and the backside electrode, and a through-current prevention circuit configured to prevent the first switch and the second switch from being turned on simultaneously.

The substrate electric potential stabilization circuit prevents a through-current flowing in this circuit.

DETAIL DESCRIPTION OF PREFERRED EMBODIMENTS

Each embodiment and modification described in the following are only an example of the present disclosure, and the present disclosure is not limited to each embodiment and modification. Various changes may be made according to a design or the like without departing from a technical idea in accordance with the present disclosure, even if being other than these embodiments and modifications.

Exemplary Embodiment 1

(1) Summary

Figure 1A:
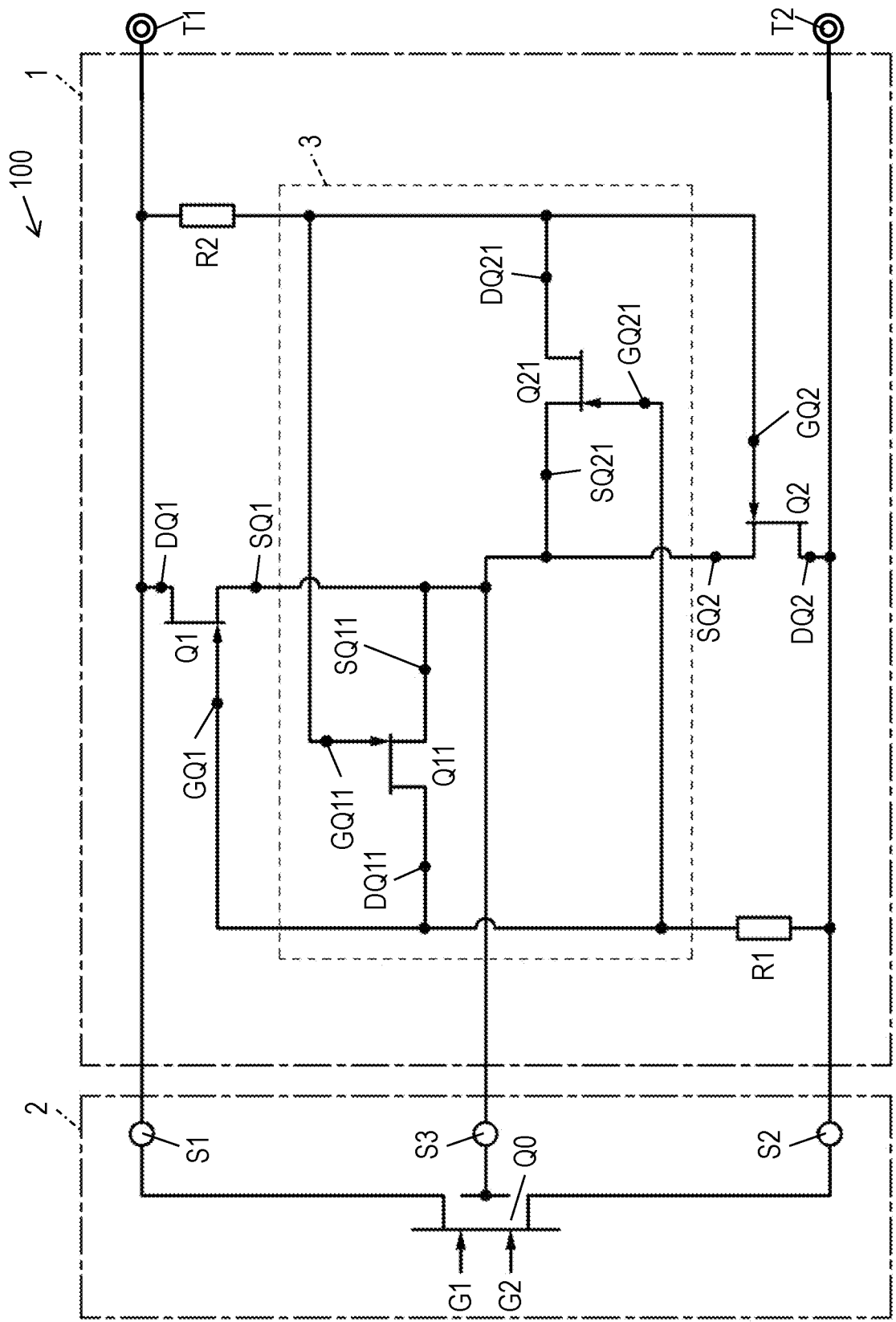
FIG. 1A is a circuit diagram of a bidirectional switch system in accordance with exemplary Embodiment 1.

FIG. 1A is a circuit diagram of bidirectional switch system 100 in accordance with exemplary Embodiment 1. Bidirectional switch system 100 includes substrate electric potential stabilization circuit 1, main bidirectional switch 2, and terminals T1 and T2.

Main bidirectional switch 2 includes bidirectional switch element Q0. In accordance with the embodiment, bidirectional switch element Q0 is a gallium-nitride-based semiconductor element containing gallium nitride (GaN).

Bidirectional switch element Q0 includes main electrode S1, main electrode S2, backside electrode S3, gate terminal G1 serving as a control terminal, and gate terminal G2 serving as a control terminal. In accordance with the embodiment, bidirectional switch element Q0 is a dual gate bidirectional switch element. Terminals T1 and T2 are connected to main electrodes S1 and S2, respectively.

With respect to a ground, a voltage of main electrode S1 is defined as voltage $V_{s1}$, a voltage of main electrode S2 is defined as voltage $V_{s1}$, a voltage of gate terminal G1 is defined as voltage $V_{s1}$, and a voltage of gate terminal G2 is defined as voltage $V_{g2}$. With respect to voltage $V_{s1}$ of main electrode S1, voltage $V_{g1}$ of gate terminal G1 is defined as voltage $V_{gs1}$. With respect to voltage $V_{s2}$ of main electrode S2, voltage $V_{g2}$ of gate terminal G2 is defined as voltage $V_{gs2}$.

When voltage $V_{gs1}$ is higher than a threshold voltage and voltage $V_{gs2}$ is higher than the threshold voltage, bidirectional switch element Q0 is turned on, thus electrically connecting main electrode S1 to main electrode S2.

When voltage $V_{gs1}$ is lower than the threshold voltage and voltage $V_{gs2}$ is lower than the threshold voltage, bidirectional switch element Q0 is turned off, thus preventing a current from main electrode S1 to main electrode S2 and a current from main electrode S2 to main electrode S1.

When voltage $V_{gs1}$ is higher than the threshold voltage and voltage $V_{gs2}$ is lower than the threshold voltage, bidirectional switch element Q0 functions as a diode with main electrode S1 as a cathode and main electrode S2 as an anode, thus allowing a current to flow from main electrode S2 to main electrode S1 and preventing a current from flowing from main electrode S1 to main electrode S2.

When voltage $V_{gs1}$ is lower than the threshold voltage and voltage $V_{gs2}$ is higher than the threshold voltage, bidirectional switch element Q0 functions as a diode with main electrode S1 as an anode and main electrode S2 as a cathode, thus allowing a current to flow from main electrode S1 to main electrode S2 and preventing a current from flowing from main electrode S2 to main electrode S1.

Bidirectional switch element Q0 is a heterojunction field effect transistor (Heterojunction Field Effect Transistor). In accordance with the embodiment, bidirectional switch element Q0 is a dual gate GaN-based Gate Injection Transistor (GIT) including a semiconductor layer made of gallium nitride. The GIT, a gallium-nitride-based semiconductor element, is also a bidirectional GIT that has a large band gap and achieves normally-off operation and low on-resistance.

Figure 1B:
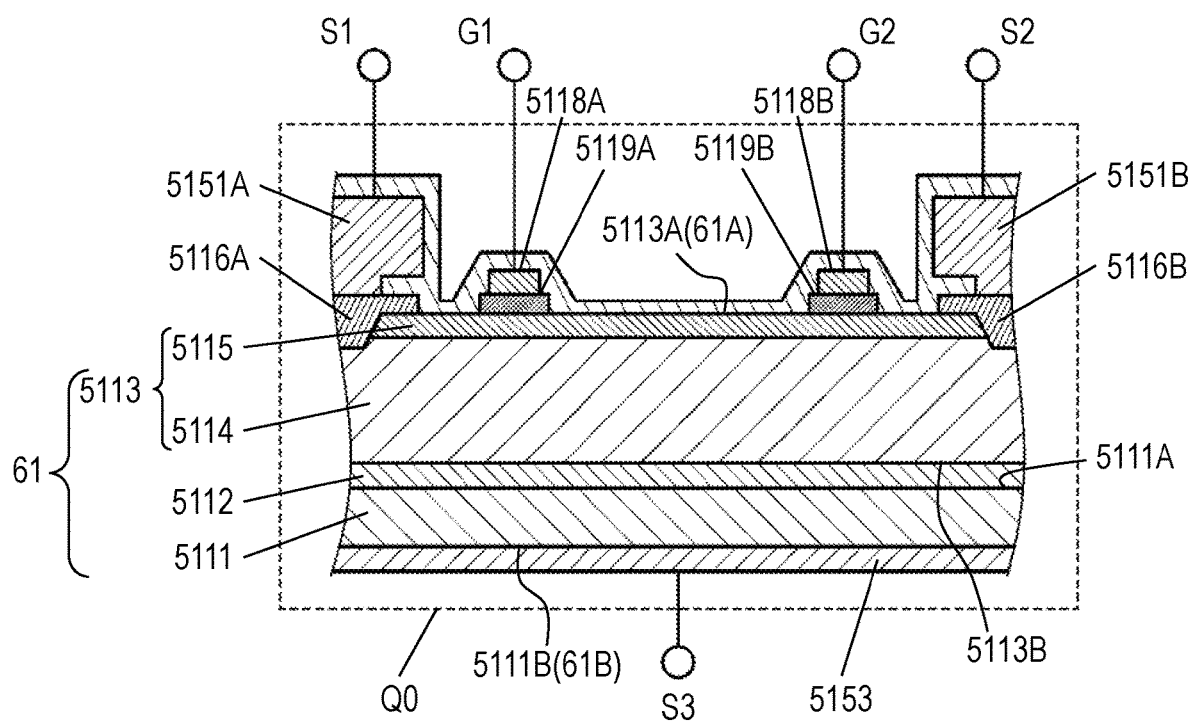
FIG. 1B is a cross-sectional view of a bidirectional switch element of the bidirectional switch system in accordance with Embodiment 1.

FIG. 1B is a cross-sectional view of bidirectional switch element Q0.

Bidirectional switch element Q0 includes semiconductor substrate 61 having main surface 61A and back surface 61B opposite to each other, main electrodes S1 and S2 provided on main surface 61A of semiconductor substrate 61, gate terminals G1 and G2 provided on main surface 61A of semiconductor substrate 61, and backside electrode S3 provided on back surface 61B of semiconductor substrate 61. Semiconductor substrate 61 includes conductive silicon (Si) substrate 5111 having surface 5111A and surface 5111B opposite to each other, and semiconductor laminate 5113 having surface 5113B provided on surface 5111A of Si substrate 5111. Semiconductor laminate 5113 has surface 5113A opposite to surface 5113B. Buffer layer 5112 is provided on surface 5111A of Si substrate 5111 and between Si substrate 5111 and semiconductor laminate 5113. Buffer layer 5112 includes aluminum nitride (AlN) layers and gallium nitride (GaN) layers stacked alternately on one another. Surface 5111B of Si substrate and surface 5113A of semiconductor laminate 5113 constitute back surface 61B and main surface 61A of semiconductor substrate 61, respectively.

Semiconductor laminate 5113 includes semiconductor layer 5114 provided on surface 5111A of Si substrate 5111 and semiconductor layer 5115 provided on semiconductor layer 5114. In accordance with Embodiment 1, semiconductor layer 5114 is an undoped gallium nitride (GaN) layer with a thickness of approximately 2 µm, and semiconductor layer 5115 is an n-type gallium aluminum nitride (AlGaN) layer with a thickness of approximately 20 nm.

Ohmic electrode 5116A and ohmic electrode 5116B are formed apart from each other on surface 5113A of semiconductor laminate 5113. Ohmic electrodes 5116A and 5116B are formed by stacking a titanium (Ti) layer and an aluminum (Al) layer, and are in ohmic contact with semiconductor layer 5114 serving as a channel area.

In bidirectional switch element Q0 shown in FIG. 1B, semiconductor layer 5115 is partially removed to reduce contact resistance. Semiconductor layer 5114 is etched by about 40 nm in depth. Thus, ohmic electrodes 5116A and 5116B contact a boundary surface between semiconductor layer 5114 and semiconductor layer 5115. Ohmic electrodes 5116A and 5116B may not directly contact semiconductor layer 5114 and be formed on an upper surface of semiconductor layer 5115.

Electrode wiring 5151A made of Au and Ti is formed on an upper surface of ohmic electrode 5116A. Electrode wiring 5151A is electrically connected to ohmic electrode 5116A. Ohmic electrode 5116A and electrode wiring 5151A are in ohmic contact with semiconductor layers 5114 and 5115 of semiconductor substrate 61, thereby constituting main electrode S1 serving as an ohmic electrode having no rectifying property. Electrode wiring 5151B made of Au and Ti is formed on an upper surface of ohmic electrode 5116B. Electrode wiring 5151B is electrically connected to ohmic electrode 5116B. Ohmic electrode 5116B and electrode wiring 5151B are in ohmic contact with semiconductor layers 5114 and 5115 of semiconductor substrate 61, thereby constituting main electrode S2 serving as an ohmic electrode having no rectifying property.

P-type semiconductor layers 5119A and 5119B apart from each other are formed selectively in an area between ohmic electrode 5116A and ohmic electrode 5116B on the upper surface of the semiconductor layer 5115. Gate electrode 5118A is formed on an upper surface of p-type semiconductor layer 5119A, and gate electrode 5118B is formed on an upper surface of p-type semiconductor layer 5119B. Gate electrodes 5118A and 5118B are in ohmic contact with p-type semiconductor layers 5119A and 5119B, respectively. In the case that p-type semiconductor layers 5119A and 5119B are made of gallium-nitride-based semiconductor, the crystallinity of p-type semiconductor layers 5119A and 5119B will be improved, thereby reducing a fault caused by a crystal defect, so that the reliability will be improved advantageously.

Backside electrode 5153 (S3) is formed on surface 5111B of Si substrate 5111, i.e., back surface 61B of semiconductor substrate 61. Backside electrode 5153 (S3) is formed by stacking a nickel (Ni) layer, a chromium (Cr) layer, and a silver (Ag) layer on one another, and is in ohmic contact with Si substrate 5111.

Substrate electric potential stabilization circuit 1 is electrically connected to bidirectional switch element Q0 including main electrode S1, main electrode S2, and backside electrode S3. Substrate electric potential stabilization circuit 1 includes switch Q1, switch Q2, and through-current prevention circuit 3. Switch Q1 is connected to main electrode S1 and backside electrode S3 in series between main electrode S1 and backside electrode S3. Switch Q2 is connected to main electrode S2 and backside electrode S3 in series between main electrode S2 and backside electrode S3.

Through-current prevention circuit 3 is configured to prevent switch Q1 and switch Q2 from turning on simultaneously.

Through-current prevention circuit 3 has through-current prevention switch Q11 that has gate terminal GQ11 serving as a control terminal, and through-current prevention switch Q21 that has gate terminal GQ21 serving as a control terminal. Turning on and off of through-current prevention switch Q11 is controlled by a voltage supplied to gate terminal GQ11. Turning on and off of through-current prevention switch Q21 is controlled by a voltage supplied to gate terminal GQ21.

Switch Q1 has gate terminal GQ1 serving as a control terminal. Switch Q2 has gate terminal GQ2 serving as a control terminal. Turning on and off of switch Q1 is controlled by a voltage supplied to gate terminal GQ1. Turning on and off of switch Q2 is controlled by a voltage supplied to gate terminal GQ2.

Each of switches Q1 and Q2 and through-current prevention switches Q11 and Q21 is a junction gate type field effect transistor (FET). In accordance with the embodiment, each of switches Q1 and Q2 and through-current prevention switches Q11 and Q21 is a gallium-nitride-based semiconductor element, i.e., a GIT including a p-type semiconductor as a gate terminal. In other words, each switch is a semiconductor element made of gallium nitride. In substrate electric potential stabilization circuit 1, in order to prevent an excessive voltage from being applied to each gate terminal, when switches Q1 and Q2 and through-current prevention switches Q11 and Q21 are turned on, a fixed current is supplied to resistors R1 and R2 so as to reduce the voltages of main electrodes S1 and S2 before a voltage is applied to each gate terminal. For that reason, in the case that a MOSFET is used as switches Q1 and Q2 and through-current prevention switches Q11 and Q21, a protective element, such as a Zener diode, is connected between the gate and the source, so as not to apply an excessive voltage to each gate terminal. In the case that a junction-gate FET or a GIT is used as switches Q1 and Q2 and through-current prevention switches Q11 and Q21, the protective element may be eliminated advantageously as compared with the case where a MOSFET is used. This is because, when the gate voltage exceeds a threshold voltage, the junction-gate FET and the GIT operate as a diode of which an anode is the gate terminal and a cathode is the source terminal. Thus, a current flows from the gate towards the source. In the case that a GIT is used for switches Q1 and Q2 and through-current prevention switches Q11 and Q21, the protective element, which is required when a MOSFET is used, may be eliminated advantageously. In accordance with the embodiment, bidirectional switch element Q0 and each switch, which are constituted by a gallium-nitride-based semiconductor element, are formed on the same chip, i.e., semiconductor substrate 61 shown in FIG. 1B, as a monolithic circuit. Thus, parasitic inductance in the monolithic circuit is reduced, thereby improving a stabilization effect of substrate potential.

(2) Configuration

As shown in FIG. 1A, bidirectional switch system 100 in accordance with the present embodiment includes substrate electric potential stabilization circuit 1 and main bidirectional switch 2.

Substrate electric potential stabilization circuit 1 further includes switch Q1, switch Q2, resistor R1, resistor R2, and through-current prevention circuit 3.

Switch Q1 is a transistor includes drain terminal DQ1, source terminal SQ1, and gate terminal GQ1 serving as a control terminal. Drain terminal DQ1 is connected to main electrode S1 which serves as an ohmic electrode having no rectifying property. Source terminal SQ1 is connected to backside electrode S3. Switch Q1 functions as a short-circuit switch configured to connect main electrode S1 to backside electrode S3. Specifically, drain terminal DQ1 of switch Q1 is connected to main electrode S1, and source terminal SQ1 of switch Q1 is connected to backside electrode S3. Gate terminal GQ1 of switch Q1 is connected to resistor R1.

Resistor R1 is connected to gate terminal GQ1 of switch Q1 and main electrode S2 in series between gate terminal GQ1 of switch Q1 and main electrode S2.

Switch Q2 is a transistor including drain terminal DQ2, source terminal SQ2, and gate terminal GQ2 serving as a control terminal. Drain terminal DQ2 is connected to main electrode S2 which serves as an ohmic electrode having no rectifying property. Source terminal SQ2 is connected to backside electrode S3. Switch Q2 functions as a short-circuit switch configured to connect main electrode S2 to backside electrode S3. Specifically, drain terminal DQ2 of switch Q2 is connected to main electrode S2, and source terminal SQ2 of switch Q2 is connected to backside electrode S3. Gate terminal GQ2 of the switch Q2 is connected to resistor R2.

Resistor R2 is connected to gate terminal GQ2 of the switch Q2 and main electrode S1 in series between gate terminal GQ2 of the switch Q2 and main electrode S1.

Through-current prevention circuit 3 includes through-current prevention switch Q11 and through-current prevention switch Q21. Through-current prevention switch Q11 is connected in series between gate terminal GQ1 of switch Q1 and backside electrode S3. Specifically, through-current prevention switch Q11 is a transistor including source terminal SQ11, drain terminal DQ11, and gate terminal GQ11 serving as a control terminal. Connection and disconnection between source terminal SQ11 and drain terminal DQ11 are controlled by a voltage supplied to gate terminal GQ11. Gate terminal GQ11 thus controls turning on and off of through-current prevention switch Q11. Source terminal SQ11 is connected to backside electrode S3. Drain terminal DQ11 is electrically connected via resistor R1 to main electrode S2, which serves as an ohmic electrode having no rectifying property. Source terminal SQ11 of through-current prevention switch Q11 is connected to backside electrode S3. Drain terminal DQ11 of through-current prevention switch Q11 is connected to gate terminal GQ1 of switch Q1. Gate terminal GQ11 of through-current prevention switch Q11 is connected to gate terminal GQ2 of switch Q2.

Through-current prevention switch Q21 is connected in series between gate terminal GQ2 of switch Q2 and backside electrode S3. Specifically, through-current prevention switch Q21 is a transistor including source terminal SQ21, drain terminal DQ21, and gate terminal GQ11 serving as a control terminal. Source terminal SQ21 is connected to backside electrode S3. Drain terminal DQ21 is electrically connected via resistor R2 to main electrode S1, which serves as an ohmic electrode having no rectifying properties. Connection and disconnection between source terminal SQ21 and drain terminal DQ21 are controlled by a voltage supplied to gate terminal GQ21. Gate terminal GQ21 thus controls turning on and off of through-current prevention switch Q21. Source terminal SQ21 of through-current prevention switch Q21 is connected to backside electrode S3. Drain terminal DQ21 of through-current prevention switch Q21 is connected to gate terminal GQ2 of switch Q2. Gate terminal GQ21 of through-current prevention switch Q21 is connected to gate terminal GQ1 of switch Q1.

(3) Operation

Gate terminal GQ1 of switch Q1 is connected to gate terminal GQ21 of through-current prevention switch Q21. Therefore, while switch Q1 is turned on, through-current prevention switch Q21 is turned on with gate voltage $V_{GQ1}$ of gate terminal GQ1. When through-current prevention switch Q21 is turned on, gate terminal GQ2 of switch Q2 is short-circuited to backside electrode S3. Therefore, switch Q2 is turned off.

At this moment, gate terminal GQ2 of switch Q2 is short-circuited to backside electrode S3 by through-current prevention switch Q21, thereby stabilizing gate voltage $V_{GQ2}$ of switch Q2 which is turned off. In this way, switch Q1 is turned on while switch Q2 is turned off, i.e., switch Q1 and switch Q2 have different states from each other.

Gate terminal GQ2 is connected to gate terminal GQ11 of through-current prevention switch Q11. When switch Q2 is turned on, through-current prevention switch Q11 is turned on by gate voltage $V_{GQ2}$ of gate terminal GQ2. When through-current prevention switch Q11 is turned on, gate terminal GQ1 of switch Q1 is short-circuited to backside electrode S3. Therefore, switch Q1 is turned off. In this way, switch Q1 is turned off while switch Q2 is turned on, i.e., switch Q1 and switch Q2 have different states from each other.

At this moment, gate terminal GQ1 of switch Q1 is short-circuited to backside electrode S3 by through-current prevention switch Q11, thereby stabilizing gate voltage $V_{GQ1}$ of switch Q1 which is turned off.

When both switch Q1 and switch Q2 are turned off, through-current prevention switch Q11 and through-current prevention switch Q21 both are turned off.

In substrate electric potential stabilization circuit 1 of the present embodiment, through-current prevention circuit 3 prevents switch Q1 and switch Q2 from turning on simultaneously.

Figure 2A:
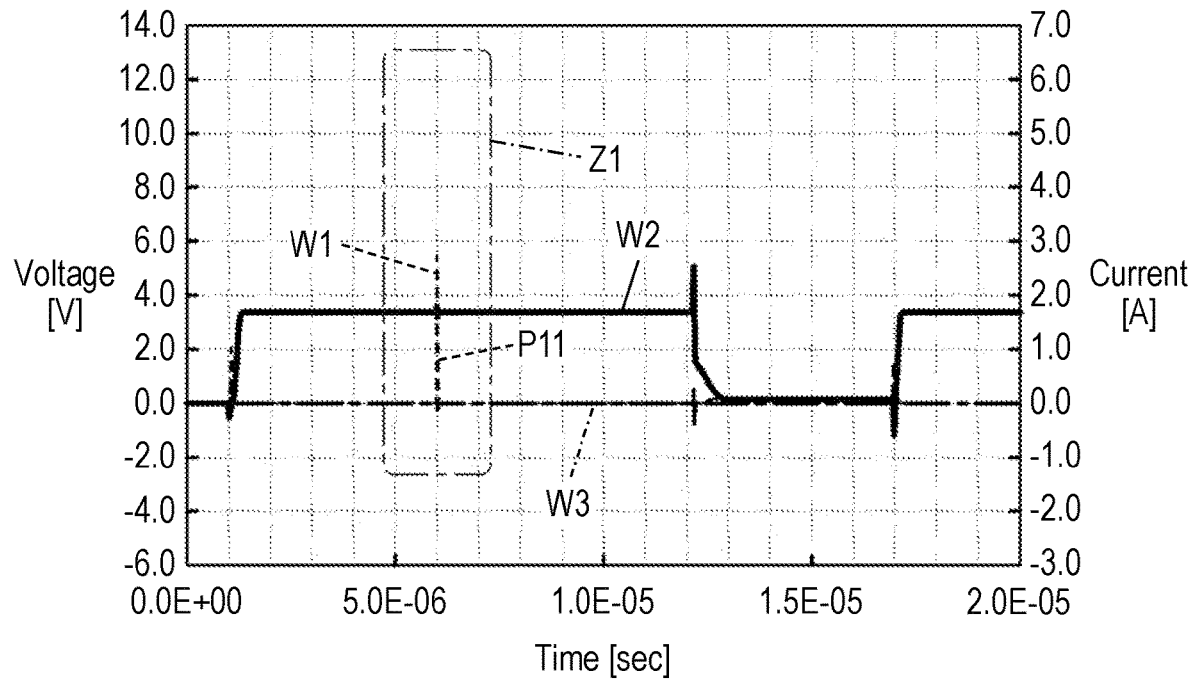
FIG. 2A shows a circuit simulation result of the above bidirectional switch system.
Figure 2B:
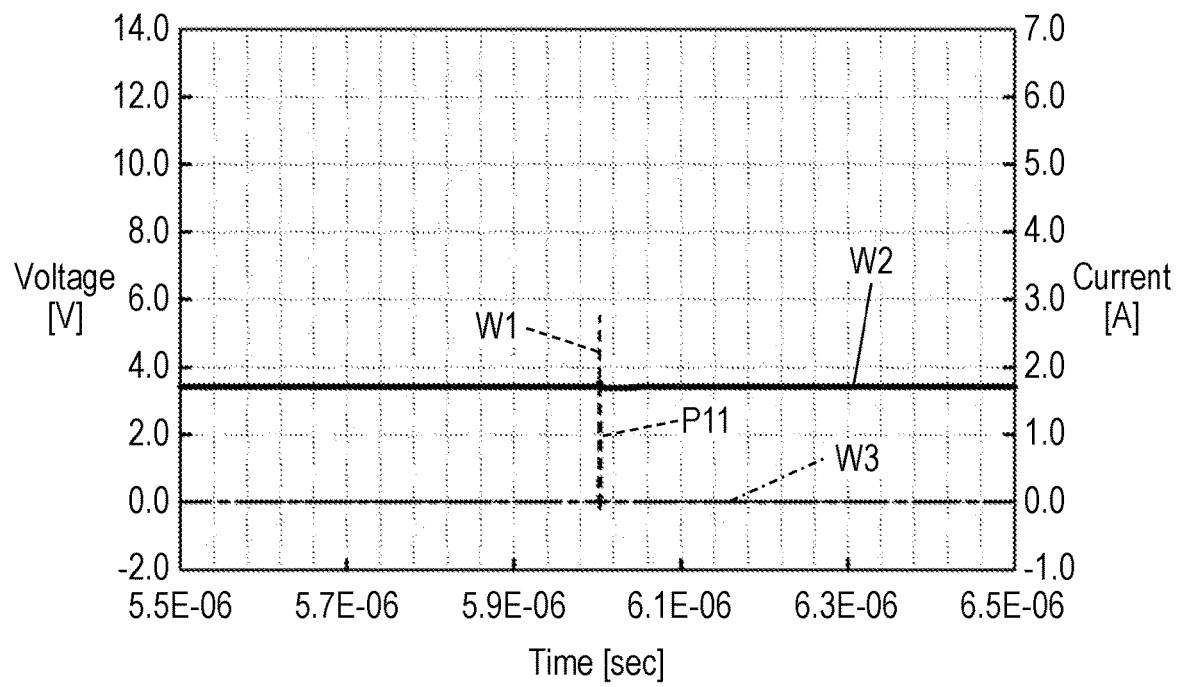
FIG. 2B is an enlarged view of FIG. 2A.
Figure 2C:
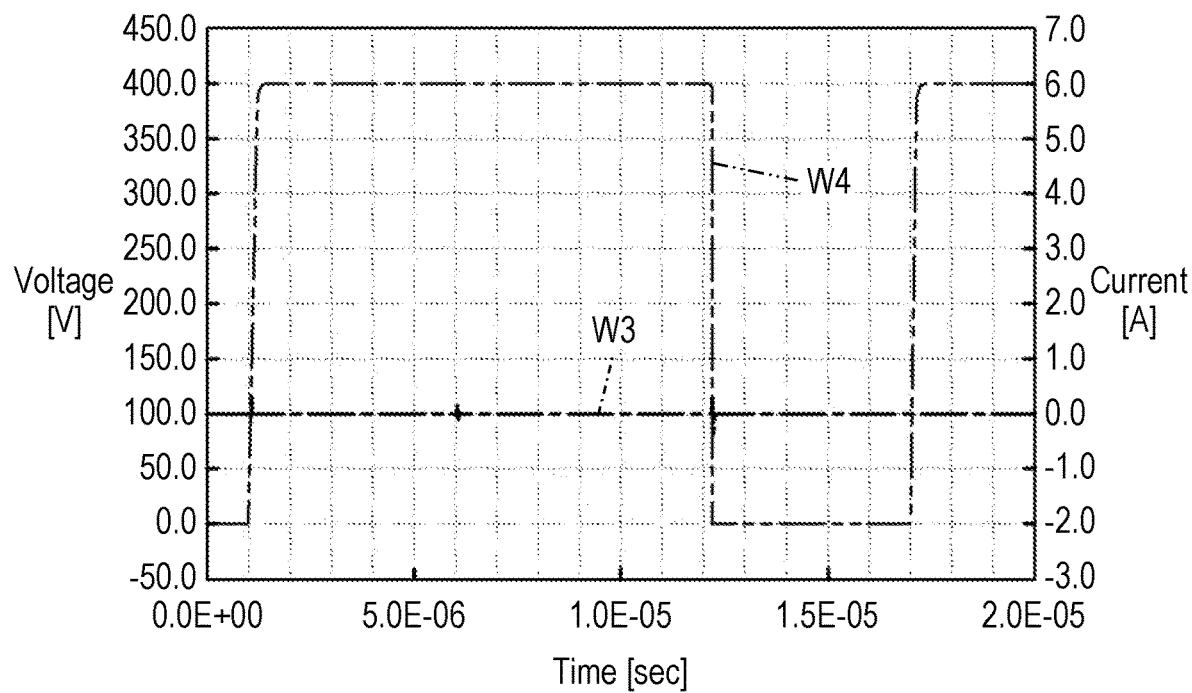
FIG. 2C shows circuit simulation results of a potential difference and a current flowing in a switch of the bidirectional switch system.

Circuit simulation results of the above-mentioned operation of substrate electric potential stabilization circuit 1 are shown in FIGS. 2A to 2C. In FIGS. 2A to 2C, trace W1 indicates gate voltage $V_{GQ1}$ of switch Q1, trace W2 indicates gate voltage $V_{GQ2}$ of switch Q2, trace W3 indicates a current flowing in switch Q1, and trace W4 indicates a voltage difference between main electrode S1 and main electrode S2. In FIG. 2A, pulse voltage P11 is applied to gate terminal GQ1 of switch Q1 as a pseudo noise (trace W1), and a voltage with a rectangular shape is applied to gate terminal GQ2 of switch Q2. FIG. 2B shows an enlarged view of area Z1 in FIG. 2A when pulse voltage P11 is applied. As shown in FIG. 2B, even if pulse voltage P11 is applied to gate terminal GQ1 of switch Q1 as a pseudo noise, gate voltage $V_{GQ1}$ only rises instantaneously but switch Q1 is not turned on, so that no through-current flows. As shown in FIG. 2C, voltage $V_{s1s2}$ (trace W4) of difference between main electrode S1 and main electrode S2 is maintained to a predetermined voltage, being a voltage of 400V with a rectangular shape, as shown in FIG. 2C.

The above traces shows that the provision of through-current prevention circuit 3 prevents an erroneous turning-on, i.e., prevents switches Q1 and Q2 form turning on simultaneously, thus preventing a through-current flowing through switches Q1 and Q2.

As mentioned above, switch Q1 and through-current prevention switch Q21 are turned on simultaneously, or switch Q2 and through-current prevention switch Q11 are turned on simultaneously. This configuration prevents an erroneous turning-on of switch Q2 with respect to the switch Q1 or an erroneous turning-on of switch Q1 with respect to the switch Q2, thus preventing switches Q1 and Q2 from turning on simultaneously.

In the substrate voltage control circuit disclosed in PTL 1, a substrate potential is equal to a potential of a source on a low-potential side of two sources. This substrate electric potential stabilization circuit includes two short-circuit switches for short-circuiting between substrate potential and the source on the low-potential side. If these switches are simultaneously turned on due to an erroneous tuning-on, a through-current may occur, thereby causing an element breakdown or breakage of an external system.

Contrary, substrate electric potential stabilization circuit 1 in accordance with the embodiment prevents switches Q1 and Q2 from being turned on simultaneously, as mentioned above.

(4) Comparative Example

In the bidirectional switch implemented by a gallium-nitride-based semiconductor element, variation in substrate potential may deteriorate a current collapse more. The current collapse is a phenomenon in which a high drain voltage applied thereto increases an on-resistance between two source electrodes in compared with the case where a low drain voltage applied.

Figure 3:
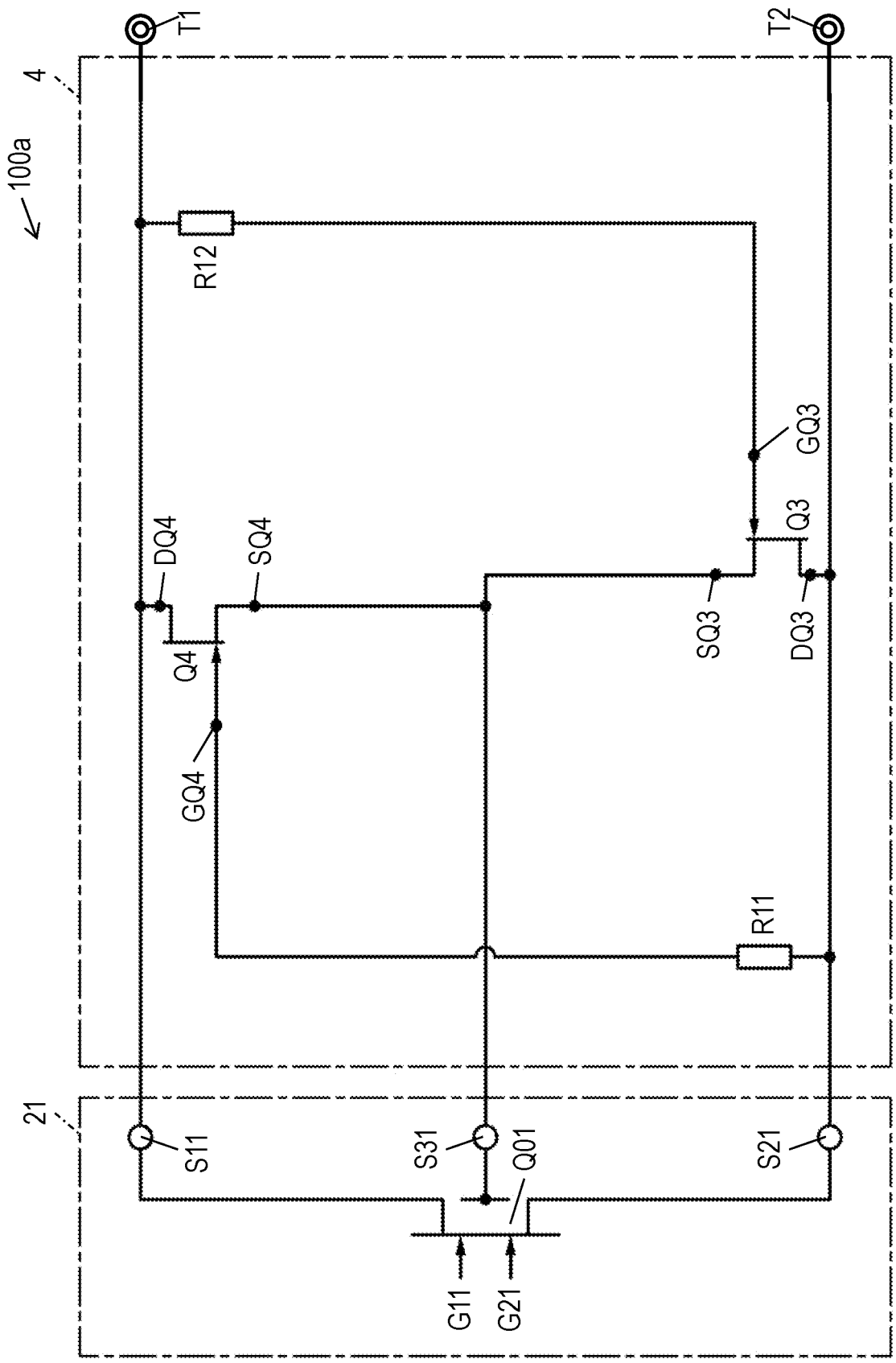
FIG. 3 is a circuit diagram of a conventional bidirectional switch system.

FIG. 3 is a circuit diagram of bidirectional switch system 100a. Bidirectional switch system 100a includes substrate electric potential stabilization circuit 4 of a comparative example. In bidirectional switch system 100a, a substrate potential of bidirectional switch element Q01 is equal to a potential of a source terminal on a low-potential side of two source terminals. Substrate electric potential stabilization circuit 4 includes two short-circuit switches short-circuiting between the backside electrode and the source terminal on the low-potential side. In bidirectional switch system 100a, main bidirectional switch 21 includes bidirectional switch element Q01 as a semiconductor element. Bidirectional switch element Q01 includes main electrode S11, main electrode S21, backside electrode S31, control terminal G11, and control terminal G21. Substrate electric potential stabilization circuit 4 further includes gate resistors R11 and R12, switch Q3, and switch Q4.

Switch Q3 is a transistor having drain terminal DQ3 connected to an ohmic electrode with no rectifying property, source terminal SQ3 connected to backside electrode S31, and gate terminal GQ3 serving as a control terminal. Switch Q3 functions as a short-circuit switch configured to connect main electrode S21 to backside electrode S31. Drain terminal DQ3 of switch Q3 is connected to main electrode S21, and source terminal SQ3 of switch Q3 is connected to backside electrode S31.

Switch Q4 is a transistor having drain terminal DQ4 connected to an ohmic electrode with no rectifying property, source terminal SQ4 connected to backside electrode S31, and gate terminal GQ4 serving as a control terminal. Switch Q4 functions as a short-circuit switch configured to connect main electrode S11 and backside electrode S31. Drain terminal DQ4 of switch Q4 is connected to main electrode S11, and source terminal SQ4 of switch Q4 is connected to backside electrode S31.

Gate resistor R11 is connected to main electrode S21 and gate terminal GQ4 of switch Q4.

Gate resistor R12 is connected to main electrode S11 and gate terminal GQ3 of switch Q3.

An operation of bidirectional switch system 100a will be described. In bidirectional switch system 100a shown in FIG. 3, in the case that a potential of main electrode S11 out of main electrodes S11 and S21 is higher than a potential of main electrode S21, the potential of main electrode S11 on a high-potential side causes main electrode S21 on a low-potential side to be short-circuited to backside electrode S3 until bidirectional switch element Q01 is turned on from turned off to decrease the voltage of gate terminal GQ3 of switch Q3 to less than a threshold voltage, thereby suppressing variation in substrate potential.

While switch Q3 is turned on, gate resistor R12 with a sufficiently large resistance and switch Q3 suppress a current flowing from main electrode S11 on the high-potential side to a sufficiently low value. At this moment, switch Q4 is turned off. In this state, as long as switch Q4 operates normally, there is no problem. However, in this state, if a noise enters switch Q4, for example, to turn on switch Q4 which has been turned off for a short time, a through-current flows through switches Q3 and Q4 from main electrode S11 on the high-potential side to main electrode S21 on the low-potential side. Alternatively, while switch Q4 is turned on and switch Q3 is turned off, a noise entering switch Q3 causes a through-current to flow through switches Q3 and Q4 similarly. In other words, in substrate electric potential stabilization circuit 4 shown in FIG. 3, switch Q3 and switch Q4 may be turned on simultaneously when a noise enters since switch Q3 and switch Q4 operate independently of each other.

Figure 4A:
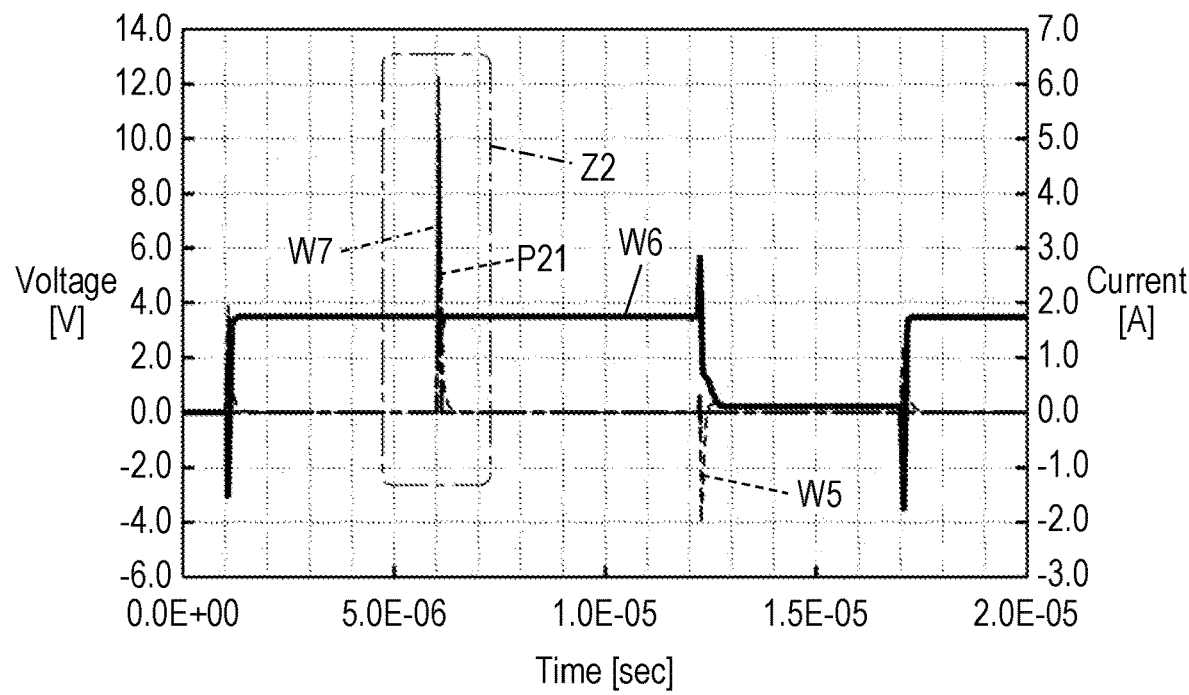
FIG. 4A shows a circuit simulation result of the above bidirectional switch system.
Figure 4B:
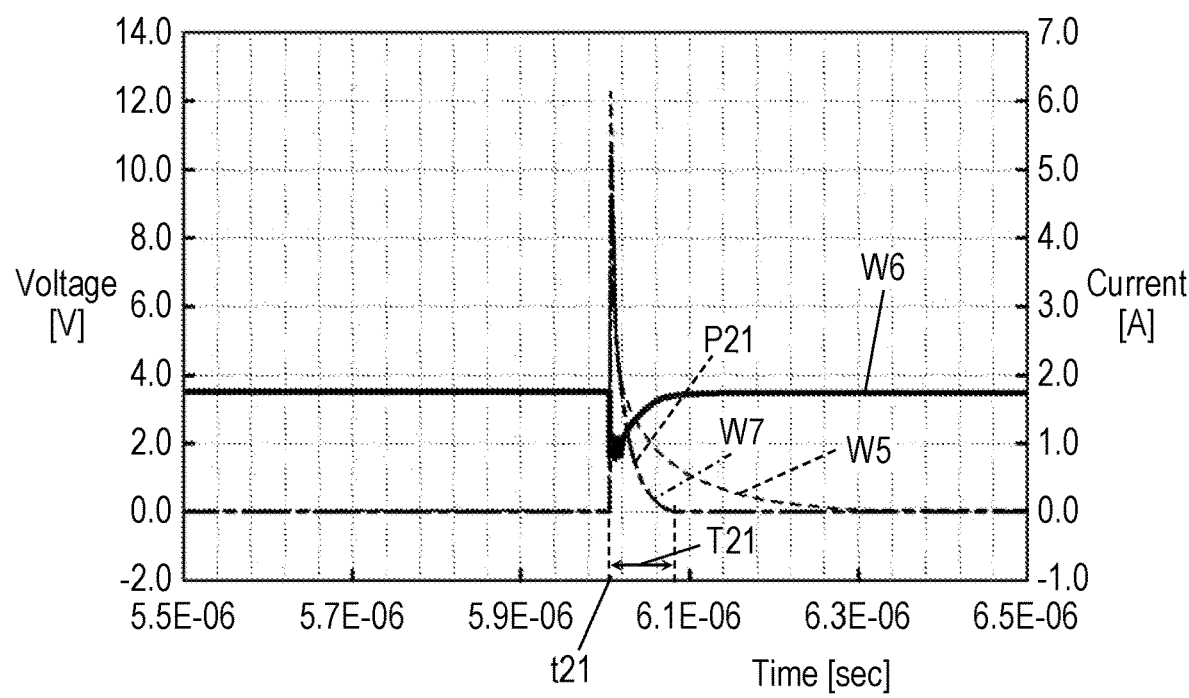
FIG. 4B is an enlarged view of FIG. 4A.
Figure 4C:
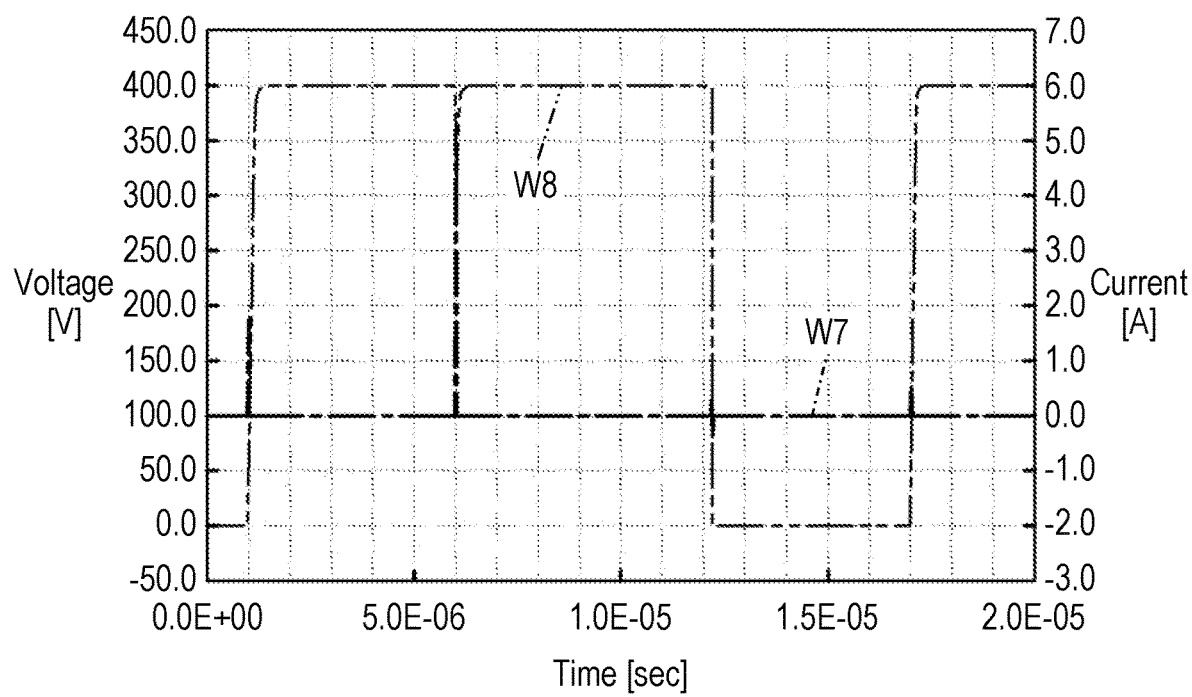
FIG. 4C shows circuit simulation results of a potential difference and a current flowing in a switch of the bidirectional switch system.

Circuit simulation results of bidirectional switch system 100a are shown in FIGS. 4A to 4C. In FIGS. 4A to 4C, trace W5 indicates gate voltage $V_{GQ4}$ of switch Q4, trace W6 indicates gate voltage $V_{GQ3}$ of switch Q3, trace W7 indicates current IQ4 flowing in switch Q4, and trace W8 indicates potential difference $V_{s11s21}$ between main electrode S11 and main electrode S21. In FIG. 4A, pulse voltage P21, a pseudo noise, applied to gate voltage $V_{GQ4}$ (trace W5) at time t21 causes and current IQ4 (trace W7) to rises sharp from OA. FIG. 4B shows an enlarged view of area Z2 in FIG. 4A. As shown in FIG. 4B, current IQ4 (trace W7) returns to OA when predetermined time T21 has elapsed from time t21 after pulse voltage P21 is applied. Further, a temporary fall occurs in gate voltage $V_{GQ3}$ (trace W6). FIG. 4C shows current IQ4 (trace W7) and potential difference $V_{s1as21}$ (trace W8) between potential $V_{s11}$ of the main electrode S11 and potential $V_{s21}$ of the main electrode S21. In the simulation, with respect to a rectangular voltage of 400V, potential difference $V_{s11s21}$ instantaneously falls, when the pulse voltage is applied to switch Q4. Both switch Q3 and switch Q4 are instantaneously turned on, thereby increasing current IQ4 flowing in switch Q4 instantaneously.

(5) Advantage

Through-current prevention switch Q11 and through-current prevention switch Q21 of through-current prevention circuit 3 allows substrate electric potential stabilization circuit 1 including switch Q1 and switch Q2 to prevent occurrence of the through-current flowing through switches Q1 and Q2 in substrate electric potential stabilization circuit 1. Gate terminal GQ1 is connected to gate terminal GQ21, and gate terminal GQ2 is connected to gate terminal GQ11. Thus, switch Q1 and switch Q2 are driven complementarily in conjunction with each other. Therefore, switch Q1 and switch Q2 are prevented from being turned on simultaneously.

(6) Modification

Modifications of substrate electric potential stabilization circuit 1 will be described below. The modifications described below may be combined with the above-mentioned embodiment as necessary.

Bidirectional switch element Q0 is a dual gate bidirectional switch element, but not limited to this configuration. Bidirectional switch element Q0 implemented by a single gate bidirectional switch provides the effect of substrate electric potential stabilization circuit 1.

Bidirectional switch element Q0 is implemented by a gallium-nitride-based semiconductor element, but not limited to this configuration. Bidirectional switch element Q0 made of semiconductor materials, such as silicon and silicon carbide, other than gallium nitride may operate.

Semiconductor layers 5114 and 5115 of bidirectional switch element Q0 are made of gallium nitride, but not limited to this configuration. Semiconductor layers 5114 and 5115 made of semiconductor materials, such as silicon and silicon carbide, other than gallium nitride allow substrate electric potential stabilization circuit 1 of the present embodiment to operate.

Switch Q1, switch Q2, through-current prevention switch Q11, through-current prevention switch Q21, and the semiconductor element of bidirectional switch element Q0 are implemented by gallium-nitride-based semiconductor elements and formed on a chip as a monolithic circuit, but not limited to this configuration. Even if not being formed as the above-mentioned one-chip configuration, substrate electric potential stabilization circuit 1 may operate.

Switch Q1, switch Q2, through-current prevention switch Q11, and through-current prevention switch Q21 are implemented by a Gate Injection Transistor (GIT) including a gallium-nitride-based semiconductor element, but not limited to this configuration. Switch Q1, switch Q2, through-current prevention switch Q11, and through-current prevention switch Q21 may be implemented by a High Electron Mobility Transistor (HEMT) including a gallium-nitride-based semiconductor element, a silicon-based metal-oxide-semiconductor (MOS) FET, or the like.

Exemplary Embodiment 2

Figure 5:
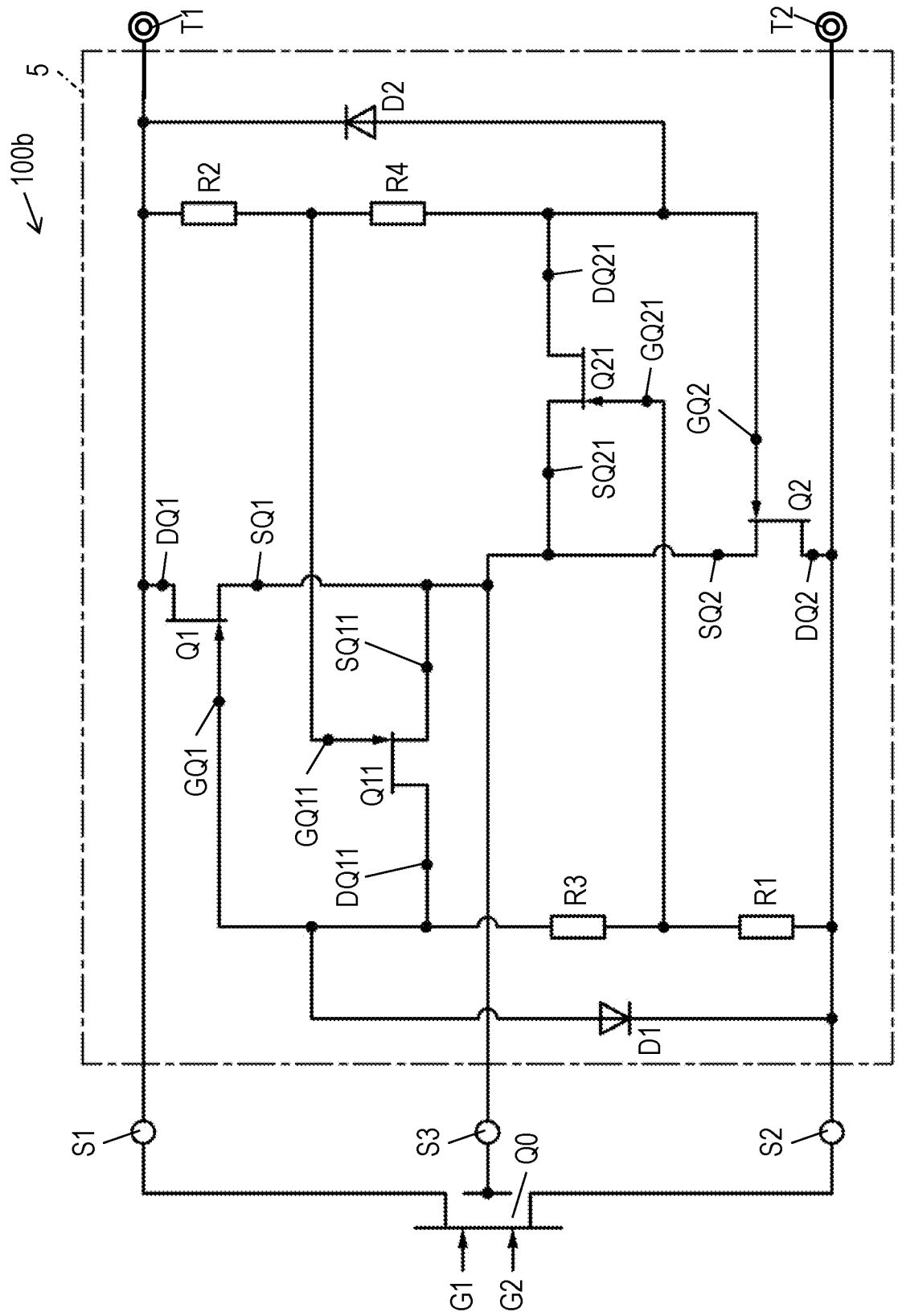
FIG. 5 is a circuit diagram of a bidirectional switch system in accordance with Exemplary Embodiment 2.

FIG. 5 is a circuit diagram of bidirectional switch system 100b in accordance with Exemplary Embodiment 2. The present embodiment is different from the first embodiment in that diode D1 serving as a rectifier, diode D2 serving as a rectifier, resistor R3, and resistor R4 are included therein. Elements identical to those of Embodiment 1 are denoted by the same reference numerals, and the description thereof is omitted.

In bidirectional switch system 100 in accordance with Embodiment 1, switch Q1 and through-current prevention switch Q21 are turned on simultaneously, and switch Q2 and through-current prevention switch Q11 are turned on simultaneously. To reduce a risk of simultaneous turning-on of switch Q1 and switch Q2, in bidirectional switch system 100b in accordance with Embodiment, through-current prevention switch Q11 and through-current prevention switch Q21 are turned on before switch Q1 and switch Q2 and turned off after switch Q1 and switch Q2. Switch Q2 which has been turned on is turned off while through-current prevention switch Q11 is turned on. Switch Q2 which has been turned off is turned on while through-current prevention switch Q11 is turned on. This configuration reduces the risk more effectively.

Bidirectional switch system 100b further includes diode D1, diode D2, resistor R3, and resistor R4 In addition to bidirectional switch system 100 in accordance with Embodiment 1. In other words, substrate electric potential stabilization circuit 5 of the embodiment includes switch Q1, switch Q2, resistor R1, resistor R2, resistor R3, resistor R4, and through-current prevention circuit 3. Differences between substrate electric potential stabilization circuit 1 of Embodiment 1 and substrate electric potential stabilization circuit 5 of the present embodiment will be described below.

Resistor R3 is connected to gate terminal GQ1 of switch Q1 and gate terminal GQ21 of through-current prevention switch Q21 in series between gate terminal GQ1 of switch Q1 and gate terminal GQ21 of through-current prevention switch Q21. In other words, gate terminal GQ1 of switch Q1 is electrically connected to gate terminal GQ21 of through-current prevention switch Q21 via resistor R3. Resistor R4 is connected to gate terminal GQ2 of switch Q2 and gate terminal GQ11 of through-current prevention switch Q1 in series between gate terminal GQ2 of switch Q2 and gate terminal GQ11 of through-current prevention switch Q11. In other words, gate terminal GQ2 of switch Q2 is electrically connected to gate terminal GQ11 of through-current prevention switch Q11 via resistor R4.

Diode D1 is connected in which a forward direction of the diode is directed from gate terminal GQ1 to main electrode S2. An anode of diode D1 is connected to gate terminal GQ1, and a cathode of diode D1 is connected to main electrode S2. Diode D2 is connected in which a forward direction of the diode is directed from gate terminal GQ2 to main electrode S1. An anode of diode D2 is connected to gate terminal GQ2, and a cathode of diode D2 is connected to main electrode S1.

Figure 6A:
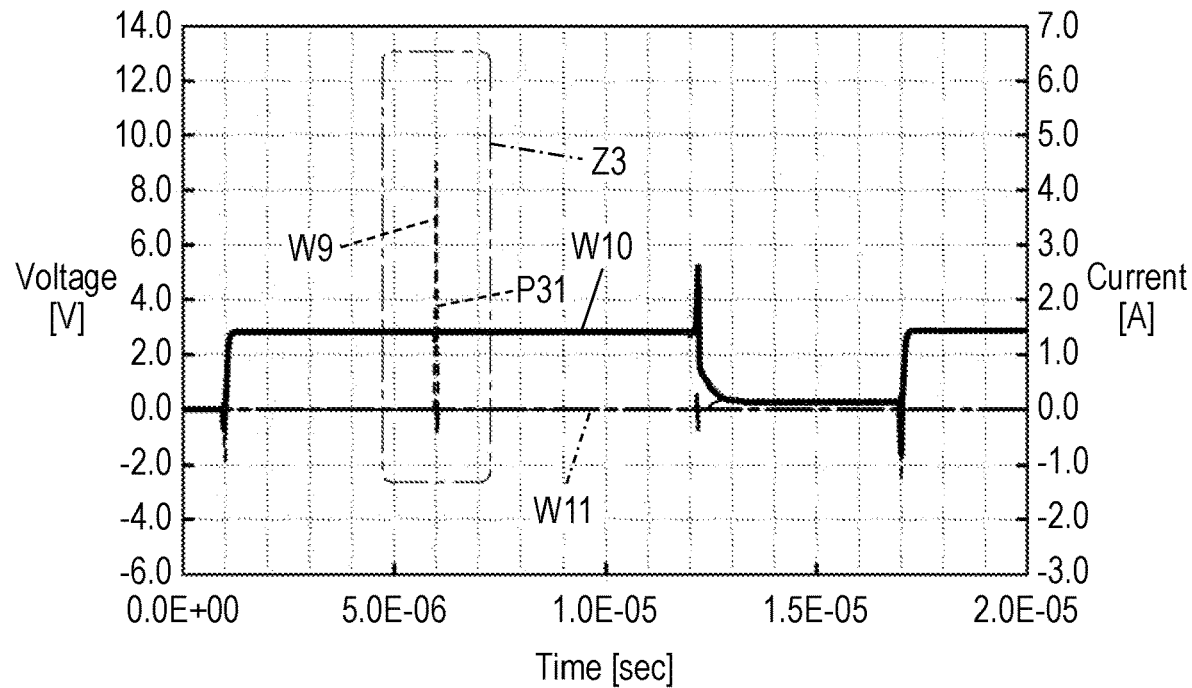
FIG. 6A shows a circuit simulation result of the above bidirectional switch system.
Figure 6B:
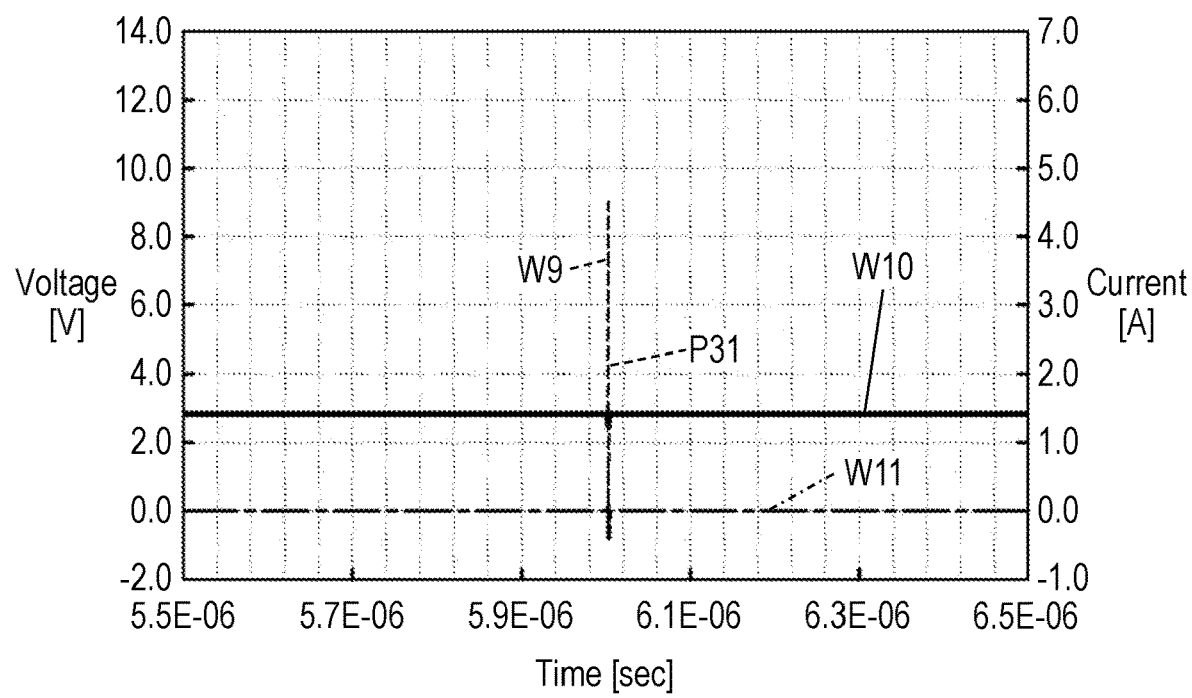
FIG. 6B is an enlarged view of FIG. 6A.

A circuit operation of bidirectional switch system 100b will be described below. FIGS. 6A to 6E show circuit simulation results of bidirectional switch system 100b. In FIGS. 6A and 6B, trace W9 indicates gate voltage $V_{GQ1}$ of switch Q1, trace W10 indicates gate voltage $V_{GQ2}$ of switch Q2, and trace W11 indicates current IQ1 flowing in switch Q1. As shown in FIG. 6A, while switch Q2 is turned on and switch Q1 is turned off, pulse voltage P31 as a pseudo noise is applied to gate terminal GQ1 of switch Q1 (trace W9). FIG. 6B shows an enlarged view of area Z3 in FIG. 6A. In FIG. 6B, even if pulse voltage P31 is applied, gate voltage $V_{GQ2}$ and current IQ1 (trace W11) flowing in switch Q1 are not changed, thus providing the same effect as Embodiment 1.

Figure 6C:
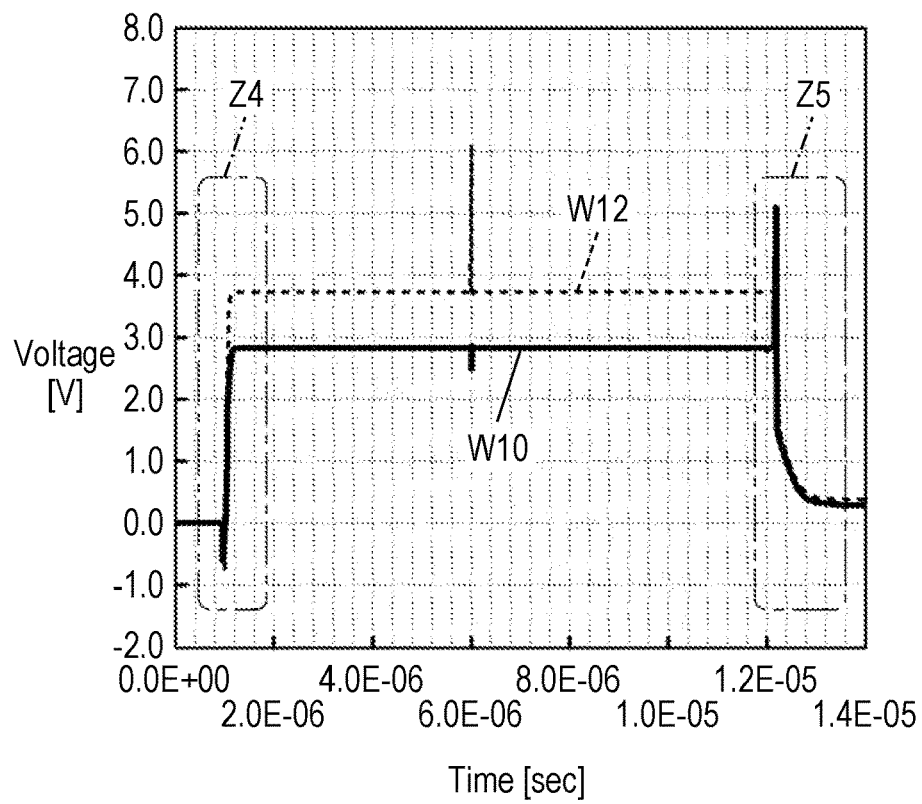
FIG. 6C shows circuit simulation results of a potential difference and a current flowing in a switch of the bidirectional switch system in accordance with Embodiment 2.
Figure 6D:
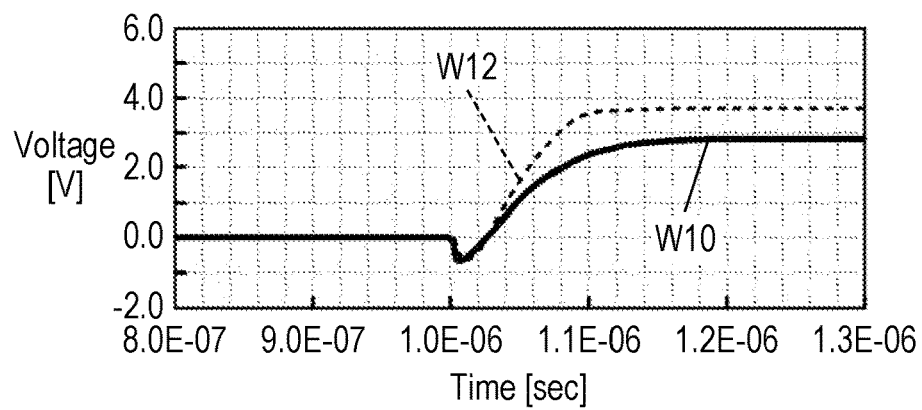
FIG. 6D is an enlarged view of FIG. 6C.
Figure 6E:
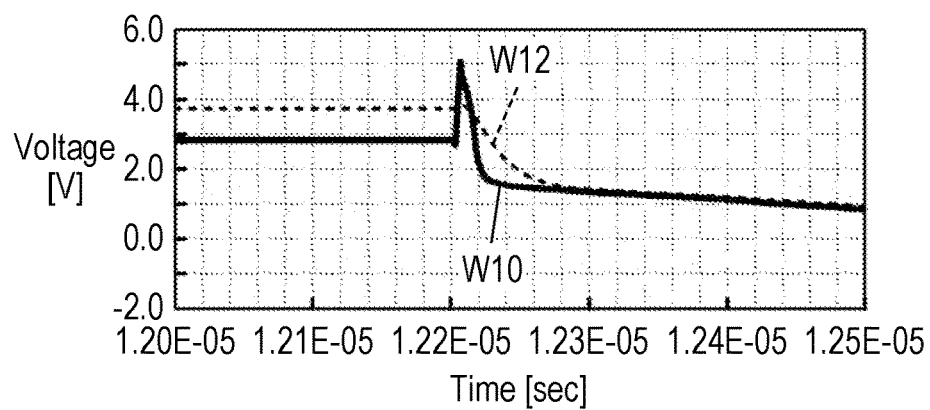
FIG. 6E is an enlarged view of FIG. 6C.

In FIGS. 6C to 6E, trace W10 indicates gate voltage $V_{GQ2}$ of switch Q2, and trace W12 indicates gate voltage $V_{GQ11}$ of through-current prevention switch Q11. FIG. 6C shows gate voltage $V_{GQ2}$ of switch Q2 and gate voltage $V_{GQ11}$ of through-current prevention switch Q11. Gate voltage $V_{GQ2}$ of switch Q2 and gate voltage $V_{GQ11}$ of through-current prevention switch Q11 have values to turn on and off switch Q11 and switch Q2 substantially simultaneously. FIG. 6D, an enlarged view of area Z4 in FIG. 6C, shows an operation when switches Q11 and Q2 are turned on. FIG. 6E is an enlarged view of area Z5 in FIG. 6C showing an operation when switches Q11 and Q2 are turned off.

When switches Q1 and Q2 and through-current prevention switches Q11 and Q21 are turned on and off by changing voltages of gate terminals GQ1, GQ2, GQ11, and GQ21, electrostatic capacitances of gate terminals GQ1, GQ2, GQ11, and GQ21 are charged and discharged. Therefore, switches Q1 and Q2 and through-current prevention switches Q11 and Q21 are turned on and off as follows. When bidirectional switch element Q0 is turned off and voltage $V_{S1S2}$ of main electrode S1 with respect to main electrode S2 as a reference of 0V rises from 0V, a resistance of a current path passing from main electrode S1 to gate terminal GQ2 of switch Q2 through resistors R2 and R4 becomes larger than a resistance of a current path passing from main electrode S1 to gate terminal GQ11 of the through-current prevention switch Q11 through resistor R2 due to resistor R4 as a gate resistor. Therefore, upon being turning on, through-current prevention switch Q11 is turned on before switch Q2 is turned on, as shown in FIG. 6D. An operation in which bidirectional switch element Q0 is turned on to decrease voltage $V_{S1S2}$ of main electrode S1 with respect to main electrode S2 to 0V will be described below. A resistance of a current path passing from gate terminal GQ2 of switch Q2 to the main electrode via diode D2 is smaller than a resistance of a current path passing from gate terminal GQ11 of through-current prevention switch Q11 to the main electrode S1 via diode D2 and resistor R4. This is because resistor R4 is inserted as a gate resistor. Therefore, upon being turned off, through-current prevention switch Q11 is turned off after switch Q2 is turned off as shown in FIG. 6E.

A relationship between switch Q1 and through-current prevention switch Q21 is also the same. When bidirectional switch element Q0 is turned off to cause voltage $V_{S2S1}$ of main electrode S2 with respect to main electrode S1 to rise from 0V, a resistance of a current path passing from main electrode S2 to gate terminal GQ1 of switch Q1 via resistors R1 and R3 is larger than a resistance of a current path passing from main electrode S2 to gate terminal GQ21 of through-current prevention switch Q21 via resistor R1 due to resistor R3 as a gate resistor. Therefore, upon being turned on, through-current prevention switch Q21 is turned on before switch Q1 is turned on. When bidirectional switch element Q0 is turned on to cause voltage $V_{S2S1}$ of main electrode S2 with respect to main electrode S1 to decreases to 0V, a resistance of a current path passing from gate terminal GQ1 of switch Q1 to main electrode S2 through diode D1 is smaller than a resistance of a current path passing from gate terminal GQ21 of through-current prevention switch Q21 to main electrode S2 through resistor R3 and diode D1 due to resistor R3 as a gate resistor. Therefore, upon being turned off, through-current prevention switch Q21 is turned off after switch Q1 is turned off.

As described above, through-current prevention switch Q11 and through-current prevention switch Q21 are turned on before switch Q1 and switch Q2 main electrode S1, and are turned off after switch Q1 and switch Q2 are turned off. This configuration reduces a risk of simultaneous turning-on of switch Q1 and switch Q2 more effectively in substrate electric potential stabilization circuit 5 as compared with substrate electric potential stabilization circuit 1 in accordance with Embodiment 1. In other word, noise immunity of substrate electric potential stabilization circuit 5 is strengthened as compared with substrate electric potential stabilization circuit 1 in accordance with Embodiment 1.

Modification

Modifications will be described below. The modifications described below may be combined with the above-mentioned embodiments.

Resistor R3 is connected to gate terminal GQ21 of through-current prevention switch Q21 and gate terminal GQ1 of switch Q1 in series between gate terminal GQ21 of through-current prevention switch Q21 and gate terminal GQ1 of switch Q1, but not limited to this configuration. Resistors R3 may be implemented by plural gate resistors connected to one another. In other word, resistor R3 is implemented by one or more resistors connected to one another.

Similarly, resistor R4 is connected to gate terminal GQ11 of through-current prevention switch Q11 and gate terminal GQ2 of switch Q2 in series between gate terminal GQ11 of through-current prevention switch Q11 and gate terminal GQ2 of switch Q2, but not limited to this configuration. Resistors R4 may be implemented by plural gate resistors connected to one another. In other word, resistor R4 is implemented by one or more resistors connected to one another.

In the case where resistor R3 is implemented by plural resistors connected in series to one another and resistor R4 is implemented by plural resistors connected in series to one another, the number of the resistors constituting resistor R3 may be different from the number of the resistors constituting resistor R4. Additionally, resistances of the resistors constituting resistor R3 may be different from resistances of the resistors constituting resistor R4.

Substrate electric potential stabilization circuit 5 in accordance with Embodiment 2 further includes the combination of diode D1 and resistor R3 and the combination of diode D2 and resistor R4 in addition to substrate electric potential stabilization circuit 1 in accordance with Embodiment 1, but not limited to this configuration. In such combinations, substrate electric potential stabilization circuit 5 may further include only the combination of diode D1 and resistor R3 in addition, but may not include the combination of diode D2 and resistor R4. Further, in such combinations, substrate electric potential stabilization circuit 5 may be configured such that only the combination of diode D2 and resistor R4 is added thereto, but the combination of diode D1 and resistor R3 is not added.

Exemplary Embodiment 3

Figure 7A:
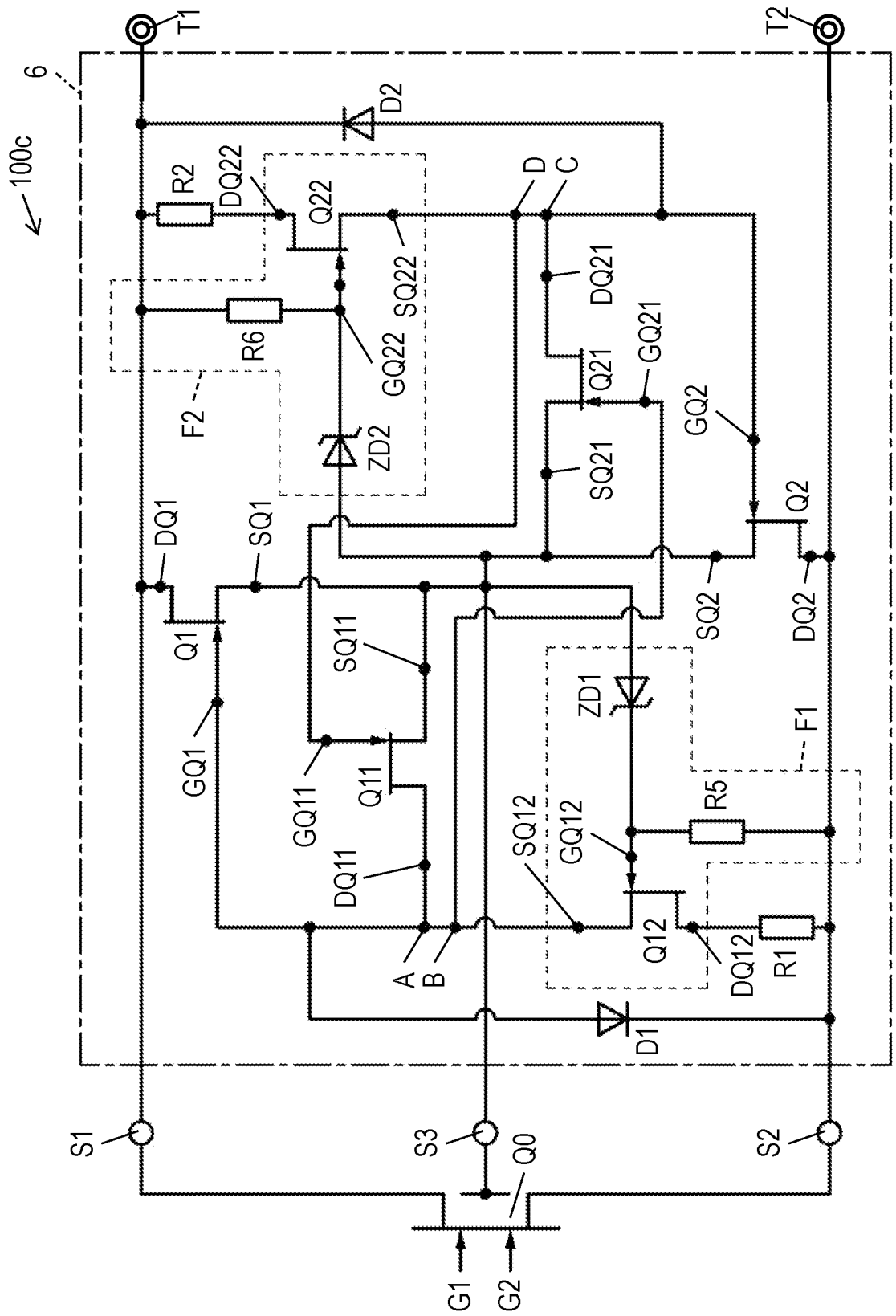
FIG. 7A is a circuit diagram of a bidirectional switch system in accordance with Exemplary Embodiment 3.

FIG. 7A is a circuit diagram of bidirectional switch system 100c in accordance with Exemplary Embodiment 3. Bidirectional switch system 100c according to the embodiment is different from bidirectional switch system 100 in accordance with Embodiment 1 in that diodes D1 and D2 and control voltage stabilization circuits F1 and F2 are added to gate terminal GQ1 of switch Q1 and gate terminal GQ2 of switch Q2, respectively. Diodes D1 and D2 are rectifiers of bidirectional switch system 100b in accordance with Embodiment 2. Control voltage stabilization circuit F1 is configured to stabilize the voltage of gate terminal GQ1 of switch Q1. Control voltage stabilization circuit F2 is configured to stabilize the voltage of gate terminal GQ2 of switch Q2. This configuration improves tolerance of substrate electric potential stabilization circuit 6 against a noise.

A circuit configuration of bidirectional switch system 100c will be described below. As shown in FIG. 7A, bidirectional switch system 100c according to the embodiment includes bidirectional switch element Q0 and substrate electric potential stabilization circuit 6. Substrate electric potential stabilization circuit 6 includes resistor R1, resistor R2, through-current prevention circuit 3, diode D1, diode D2, control voltage stabilization circuit F1, and control voltage stabilization circuit F2.

Control voltage stabilization circuit F1 includes switch Q12, resistor R5, and Zener diode ZD1. Switch Q12 is connected to resistor R1 and gate terminal GQ1 of switch Q1 in series between resistor R1 and gate terminal GQ1 of switch Q1. Switch Q12 includes drain terminal DQ12, source terminal SQ12, and gate terminal GQ12 serving as a control terminal. Drain terminal DQ12 is electrically connected via resistor R1 to main electrode S2 serving as an ohmic electrode having no rectifying property. Drain terminal DQ12 of switch Q12 is connected to resistor R1. Source terminal SQ12 of switch Q12 is connected to gate terminal GQ1 of switch Q1. A cathode of Zener diode ZD1 is connected to gate terminal GQ12 of switch Q12. An anode of Zener diode ZD1 is connected to backside electrode S3. Resistor R5 is connected to gate terminal GQ12 of switch Q12 and main electrode S2 in series between gate terminal GQ12 of switch Q12 and main electrode S2.

Control voltage stabilization circuit F2 includes switch Q22, resistor R6, and Zener diode ZD2. Switch Q22 is connected to resistor R2 and gate terminal GQ2 of switch Q2 in series between resistor R2 and gate terminal GQ2 of switch Q2. Switch Q22 includes drain terminal DQ22, source terminal SQ22, and gate terminal GQ22 serving as a control terminal. Drain terminal DQ22 is electrically connected via resistor R2 to main electrode S1 serving as an ohmic electrode having no rectifying property. Drain terminal DQ22 of switch Q22 is connected to resistor R2. Source terminal SQ22 of switch Q22 is connected to gate terminal GQ2 of switch Q2. A cathode of Zener diode ZD2 is connected to gate terminal GQ22 of switch Q22. An anode of Zener diode ZD2 is connected to backside electrode S3. Resistor R6 is connected to the gate terminal GQ22 of switch Q22 and main electrode S1 in series between the gate terminal GQ22 of the switch Q22 and main electrode S1.

A circuit operation of bidirectional switch system 100c will be described below. First, control voltage stabilization circuit F1 and control voltage stabilization circuit F2 which are different from the first embodiment will be described. When bidirectional switch element Q0 is continuously turned off or is turned off, a voltage applied to control voltage stabilization circuit F1 from main electrode S2 (terminal T2) causes a current to flow into Zener diode ZD1 through resistor R5. Reference voltage $V_{ZD1}$ is generated between the anode and the cathode of Zener diode ZD1. Potential difference $V_{GS}$ between gate terminal GQ12 and source terminal SQ12 of switch Q12 decreases as an output voltage of source terminal SQ12 of switch Q12 increases, and finally converges to $V_{th}$. As a result, the output voltage of source terminal SQ12 of switch Q12 becomes a constant voltage, $V_{ZD1}-V_{th}$. This output voltage is applied to gate terminal GQ1 of switch Q1. Therefore, the tolerance of gate terminal GQ1 of the switch Q1 to a noise is improved.

Control voltage stabilization circuit F2 operates similarly. When bidirectional switch element Q0 is continuously turned off or is turned off, a voltage applied to control voltage stabilization circuit F1 from main electrode S1 (terminal T1) causes a current to flow into Zener diode ZD2 through resistor R6. Reference voltage $V_{ZD2}$ is generated between the anode and the cathode of Zener diode ZD2. Potential difference $V_{GS}$ between gate terminal GQ22 and source terminal SQ22 of switch Q22 is decreased as an output voltage of source terminal SQ22 of switch Q22 increases, and finally converges to $V_{th}$. As a result, the output voltage of source terminal SQ22 of switch Q22 becomes a constant voltage, $V_{ZD2}-V_{th}$. This output voltage is applied to gate terminal GQ2 of switch Q2. Therefore, the tolerance of gate terminal GQ2 of switch Q2 to a noise is improved.

An entire operation of substrate electric potential stabilization circuit 6 is the same as in Embodiment 1, the description thereof is omitted.

As described above, substrate electric potential stabilization circuit 6 prevents switch Q1 and switch Q2 from being turned on simultaneously. Further, noise immunity of each gate of switch Q1 and switch Q2 can be improved. Control voltage stabilization circuits F1 and F2 protect switches Q1 and Q2, respectively.

Modification of Embodiment 3

Modifications of substrate electric potential stabilization circuit 6 in accordance with Embodiment 3 will be described below. The modifications described below may be combined with the above-mentioned embodiments.

Substrate electric potential stabilization circuit 6 in accordance with Embodiment 3 includes through-current prevention circuit 3, control voltage stabilization circuit F1, and control voltage stabilization circuit F2, but not limited to this configuration. Control voltage stabilization circuit F1 and control voltage stabilization circuit F2 may be provided independently from each other. In other word, only at least one of control voltage stabilization circuit F1 and control voltage stabilization circuit F2 may be provided, rather than combination of through-current prevention circuit 3, control voltage stabilization circuit F1, and control voltage stabilization circuit F2.

Figure 7B:
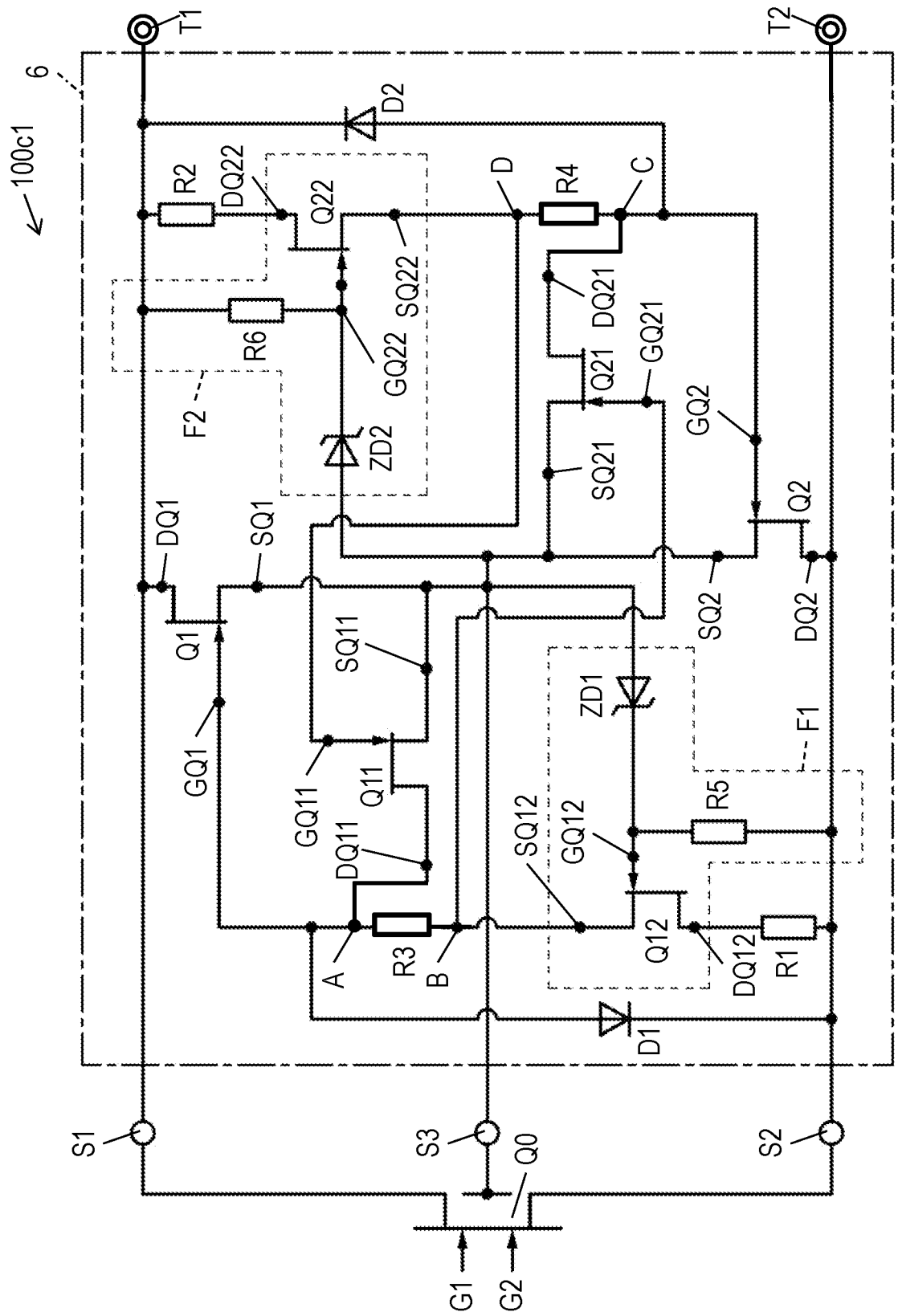
FIG. 7B is a circuit diagram of another bidirectional switch system in accordance with Embodiment 3.

FIG. 7B is a circuit diagram of another bidirectional switch systems 100c1 in accordance with Embodiment 3. In FIG. 7B, elements identical to those of bidirectional switch system 100c shown in FIG. 7A are denoted b the same reference numerals. Drain terminal DQ11 of through-current prevention switch Q11 is connected to an anode of the diode D1 and gate terminal GQ1 of switch Q1 at node A. Gate terminal GQ21 of through-current prevention switch Q21 is connected to source terminal SQ12 of switch Q12 at node B. In bidirectional switch system 100c shown in FIG. 7A, node A is directly connected to node B only with wiring. In bidirectional switch system 100c1 shown in FIG. 7B, node A is connected to node B via resistor R3. Resistor R3 is connected series to nodes A and B in series between nodes A and B, providing the same synergistic effect with Embodiment 2.

In bidirectional switch system 100c shown in FIG. 7A, drain terminal DQ21 of through-current prevention switch Q21 is connected to an anode of diode D2 and gate terminal GQ2 of switch Q2 at node C. Gate terminal GQ11 of through-current prevention switch Q11 is connected to source terminal SQ22 of switch Q22 at node D. Node C is directly connected to node D only with wiring. In bidirectional switch system 100c1 shown in FIG. 7B, node C is connected to node D via resistor R4 described in Embodiment 2. Resistor R4 is connected to nodes C and D in series between nodes C and D, providing a synergistic effect with Embodiment 2.

Exemplary Embodiment 4

Figure 8:
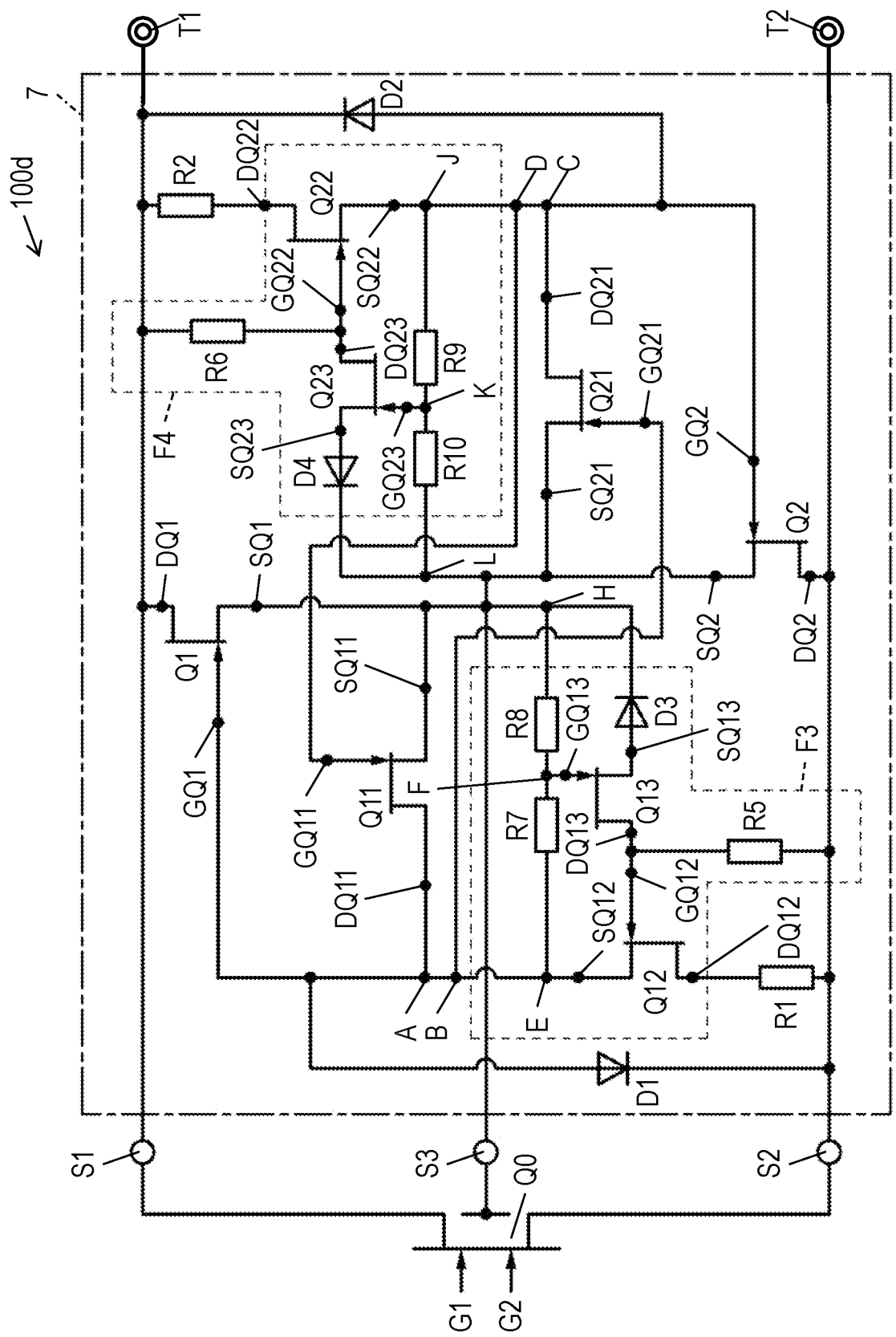
FIG. 8 is a circuit diagram of a bidirectional switch system in accordance with Exemplary Embodiment 4.

FIG. 8 is a circuit diagram of bidirectional switch system 100d in accordance with Exemplary Embodiment 4. Bidirectional switch systems 100d includes bidirectional switch element Q0 and substrate electric potential stabilization circuit 7. Substrate electric potential stabilization circuit 7 includes resistor R1, resistor R2, diodes D1 and D2, control voltage stabilization circuit F3, control voltage stabilization circuit F4, and through-current prevention circuit 3. In FIG. 8, elements identical to those of bidirectional switch system 100c in accordance with Embodiment 3 shown in FIG. 7A are denoted by the same reference numerals. Control voltage stabilization circuit F3 shown in FIG. 8 includes diode D3 and switch Q13 instead of Zener diode ZD1 of control voltage stabilization circuit F1 in accordance with Embodiment 3, and further includes resistor R7 and resistor R8. Switch Q13 is implemented by a GIT that is a gallium-nitride-based semiconductor element. Control voltage stabilization circuit F4 includes diode D4 and switch Q23 instead of Zener diode ZD2 of control voltage stabilization circuit F2 shown in FIG. 7A, and further includes resistor R9 and resistor R10. Switch Q23 is implemented by a GIT that is a gallium-nitride-based semiconductor element.

A circuit configuration of substrate electric potential stabilization circuit 7 will be described below with reference to FIG. 8. Gate terminal GQ21 of through-current prevention switch Q21 is directly connected to gate terminal GQ1 of switch Q1. Gate terminal GQ11 of through-current prevention switch Q11 is directly connected to gate terminal GQ2 of switch Q2.

Control voltage stabilization circuit F3 includes switch Q13, diode D3, resistor R7, and resistor R8 instead of Zener diode ZD1 shown in FIG. 7A. Switch Q13 includes drain terminal DQ13, gate terminal GQ13 serving as a control terminal, and source terminal SQ13 connected to backside electrode S3 via diode D3. Drain terminal DQ13 is electrically connected via resistor R5 to main electrode S2 which serves as an ohmic electrode with no rectifying property. Resistor R5 is connected to drain terminal DQ13 and main electrode S2 in series between drain terminal DQ13 and main electrode S2. Drain terminal DQ13 of switch Q13 is connected to gate terminal GQ12 of switch Q12. Source terminal SQ13 of switch Q13 is connected to an anode of diode D3. A cathode of diode D3 is connected to backside electrode S3. Resistor R7 is connected to resistor R8. Resistor R7 is connected to gate terminal GQ1 of switch Q1. Resistor R8 is connected to backside electrode S3.

Resistor R7 is connected to gate terminal GQ1 of switch Q1 at node E. Resistor R7 is connected to resistor R8 at node F. Resistor R8 is connected to backside electrode S3 at node H. Node F is connected to gate terminal GQ13 of switch Q13. Resistor R7 is connected to gate terminal GQ1 of switch Q1 and node F in series between gate terminal GQ1 of switch Q1 and node F. Resistor R8 is connected to node F and backside electrode S3 in series between node F and backside electrode S3. The cathode of diode D3 is connected to backside electrode S3. Switch Q13 is connected to the anode of diode D3 and resistor R5 in series between the anode of diode D3 and resistor R5. Switch Q13 includes gate terminal GQ13 configured to control turning on and off of switch Q13. Gate terminal GQ13 of switch Q13 is connected to node F. Resistor R5 is connected to gate terminal GQ12 of switch Q12 and main electrode S2 in series between gate terminal GQ12 of switch Q12 and main electrode S2.

Control voltage stabilization circuit F4 includes switch Q23, diode D4, resistor R9, and resistor R10 instead of Zener diode ZD2 shown in FIG. 7A. Switch Q23 includes drain terminal DQ23, gate terminal GQ23 serving as a control terminal, and source terminal SQ23 connected to backside electrode S3 via diode D4. Drain terminal DQ23 is electrically connected via resistor R6 to main electrode S1 which serves as an ohmic electrode with no rectifying property. Drain terminal DQ23 of switch Q23 is connected to gate terminal GQ22 of switch Q22. Source terminal SQ23 of switch Q23 is connected to an anode of diode D4. A cathode of diode D4 is connected to backside electrode S3.

Resistor R9 is connected to resistor R10. Resistor R9 is connected to gate terminal GQ2 of switch Q2. Resistor R10 is connected to backside electrode S3. Resistor R9 is connected to gate terminal GQ2 of switch Q2 at node J. Resistor R9 is connected to resistor R10 at node K. Resistor R10 is connected to backside electrode S3 at node L. Node K is connected to gate terminal GQ23 of switch Q23. Resistor R9 is connected to gate terminal GQ2 of switch Q2 and node K in series between gate terminal GQ2 of switch Q2 and node K. Resistor R10 is connected to node K and backside electrode S3 in series between node K and backside electrode S3. The cathode of diode D4 is connected to backside electrode S3. Switch Q23 is connected to the anode of diode D4 and resistor R6 in series between the anode of diode D4 and resistor R6. Switch Q23 includes gate terminal GQ23 configured to control turning on and off of switch Q23. Gate terminal GQ23 of switch Q23 is connected to node K. Resistor R6 is connected to gate terminal GQ22 of switch Q22 and main electrode S1 in series between gate terminal GQ22 of switch Q22 and main electrode S1.

The other circuit configuration of substrate electric potential stabilization circuit 7 is the same as substrate electric potential stabilization circuit 6 shown in FIG. 7A, and the description thereof is omitted.

A circuit operation of substrate electric potential stabilization circuit 7 will be described below. First, an operation of control voltage stabilization circuit F3 will be described based along forward voltage $V_{f3}$ of diode D3, threshold voltage $V_{th5}$ of switch Q13, potential difference $V_{EH}$ between nodes E and H, potential difference $V_{FH}$ between nodes F and H, resistance $R_{EH}$ between node E and node H, and resistance $R_{FH}$ between node F and node H.

In control voltage stabilization circuit F3, when $V_{FH} > V_{f3} + V_{th5}$ is satisfied, switch Q1 is turned off. When $V_{EH} > (V_{f3} + V_{th5}) \times R_{EH}/R_{FH}$ is satisfied, switch Q1 is turned off because of $V_{EH} = V_{FH} \times R_{EH}/R_{FH}$. Resistances $R_{EH}$ and $R_{FH}$ determined such that $(V_{f3} + V_{th5}) \times R_{EH}/R_{FH}$ is about 3V allow control voltage stabilization circuit F3 to operate as a clamping circuit configured to maintain $V_{EH} = 3V$.

An operation of control voltage stabilization circuit F4 will be described below along forward voltage $V_{f4}$ of diode D4, threshold voltage $V_{th6}$ of switch Q13, potential difference $V_{JL}$ between nodes J and L, potential difference $V_{KL}$ between nodes K and L, resistance $R_{JL}$ between nodes J and L, and resistance $R_{KL}$ between nodes K and L.

When $V_{KL} > V_{f4} + V_{th6}$ is satisfied, switch Q2 is turned off. When $V_{KL} > (V_{f4} + V_{th6}) \times R_{JL}/R_{KL}$ is satisfied, switch Q2 is turned off because of $V_{JL} = V_{KL} \times R_{JL}/R_{KL}$. Resistances $R_{JL}$ and $R_{KL}$, determined such that $(V_{f4} + V_{th6}) \times R_{JL}/R_{KL}$ is about 3V allow control voltage stabilization circuit F4 to operate as a clamping circuit configured to maintain $V_{JL} = 3V$.

The other circuit operation is the same as substrate electric potential stabilization circuit 6 in accordance with Embodiment 3, and the description thereof is omitted.

Figure 9A:
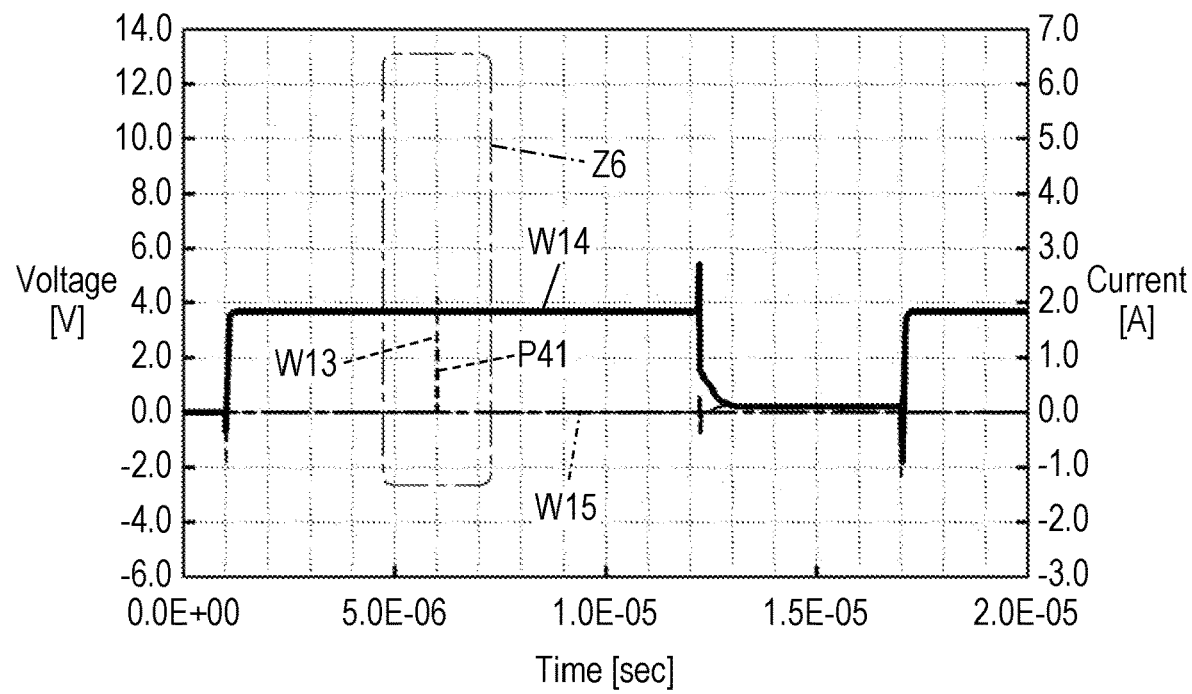
FIG. 9A shows a circuit simulation result of the above bidirectional switch system mentioned.
Figure 9B:
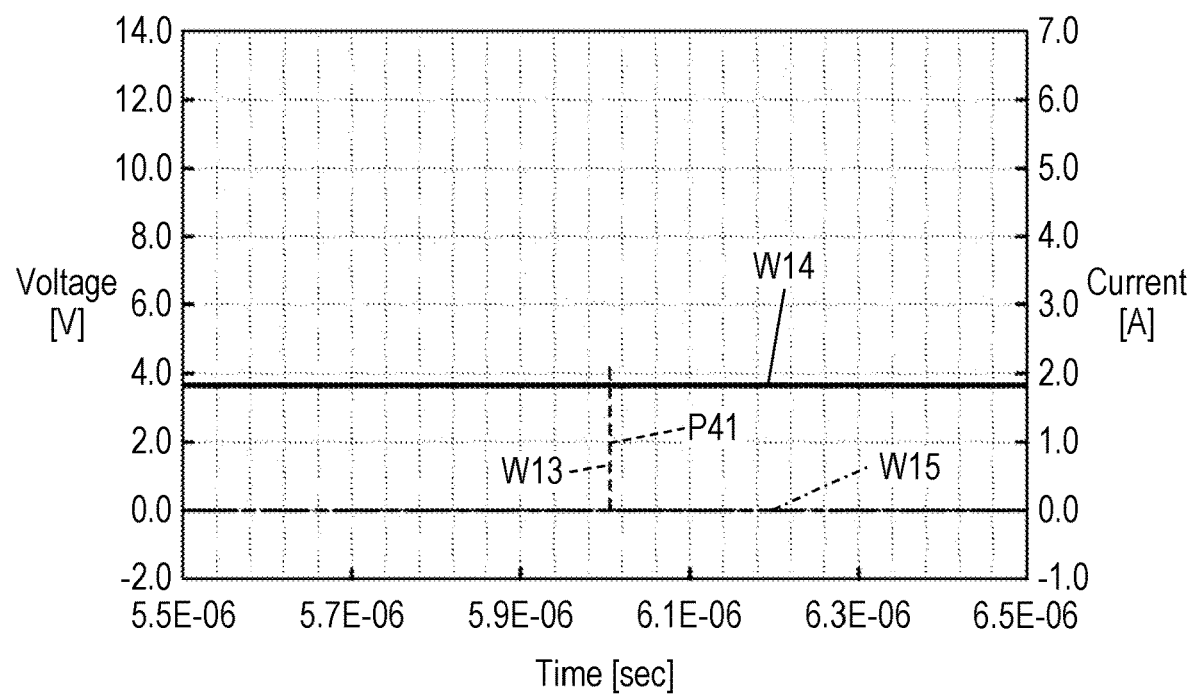
FIG. 9B is an enlarged view of FIG. 9A.

FIGS. 9A and 9B show circuit simulation results of substrate electric potential stabilization circuit 7 in accordance with the embodiment. FIG. 9A shows voltage and current when pulse voltage P41 as a pseudo noise is applied to gate terminal GQ1 of switch Q1. FIG. 9B is an enlarged view of area Z6 shown in FIG. 9A. In FIGS. 9A and 9B, trace W13 indicates gate voltage $V_{GQ1}$ of switch Q1, trace W14 indicates gate voltage $V_{GQ2}$ of switch Q2, and trace W15 indicates current IQ1 flowing in switch Q1. As shown in FIG. 9B, even if pulse voltage P41 is applied, gate voltage $V_{GQ2}$ is not changed. Further, only gate voltage $V_{GQ1}$ is changed instantaneously, but switch Q1 is not turned on, i.e., is continuously turned off. Therefore, current $I_{Q1}$ flowing in switch Q1 is not changed, and a through-current, which flows through switches Q1 and Q2, does not flow. Thus, substrate electric potential stabilization circuit 7 prevents the through-current, thereby reducing a risk of simultaneous turning-on of switch Q1 and switch Q2.

Modification of Embodiment 4

Modifications will be described below. The modifications described below may be combined with the above-mentioned embodiments.

Figure 10:
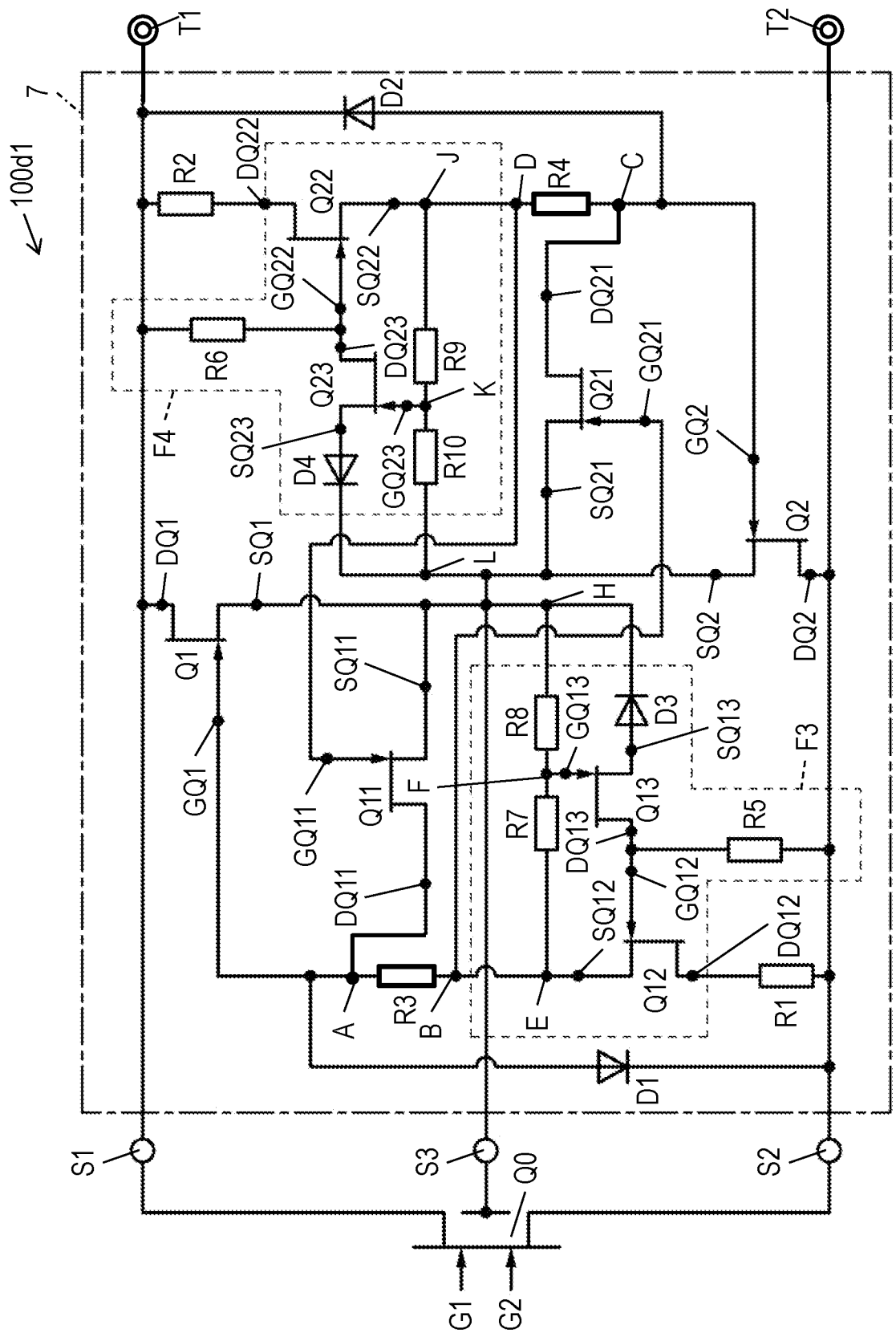
FIG. 10 is a circuit diagram of another bidirectional switch system in accordance with Embodiment 4.

FIG. 10 is a circuit diagram of another bidirectional switch systems 100d1 in accordance with Embodiment 4. In FIG. 10, element identical to those of bidirectional switch system 100d shown in FIG. 8 are denoted by the same reference numerals. In bidirectional switch system 100d shown in FIG. 8, the anode of diode D1 is connected to gate terminal GQ1 of switch Q1 at node A. Through-current prevention switch Q11 is connected to gate terminal GQ1 of switch Q1 at node B. Node A is directly connected to node B only with wiring. In bidirectional switch system 100d1 shown in FIG. 10, node A is connected to node B via resistor R3. Resistor R3 is connected to nodes A and B in series between nodes A and B. Thus, the synergistic effect with the resistor R1 as described in Embodiment 2 reduces a risk of simultaneous turning-on of switch Q1 and switch Q2 more effectively.

Similarly, in bidirectional switch systems 100d shown in FIG. 8, the anode of diode D2 is connected to gate terminal GQ2 of the switch Q2 at node C, and through-current prevention switch Q21 is connected to gate terminal GQ2 of switch Q2 at node D. Node C is directly connected to node D only with wiring. In bidirectional switch systems 100d1 shown in FIG. 10, node C is connected to node D via resistor R4. Resistor R4 is connected to nodes C and D in series between nodes C and D. A synergistic effect with the resistor R2 as described in Embodiment 2 reduces a risk of simultaneous turning-on of switch Q1 and switch Q2 more effectively.

Control voltage stabilization circuits F3 and F4 may be provided independently from through-current prevention circuit 3. At least one of control voltage stabilization circuits F3 and F4 may be provided without through-current prevention circuit 3.

Figure 11:
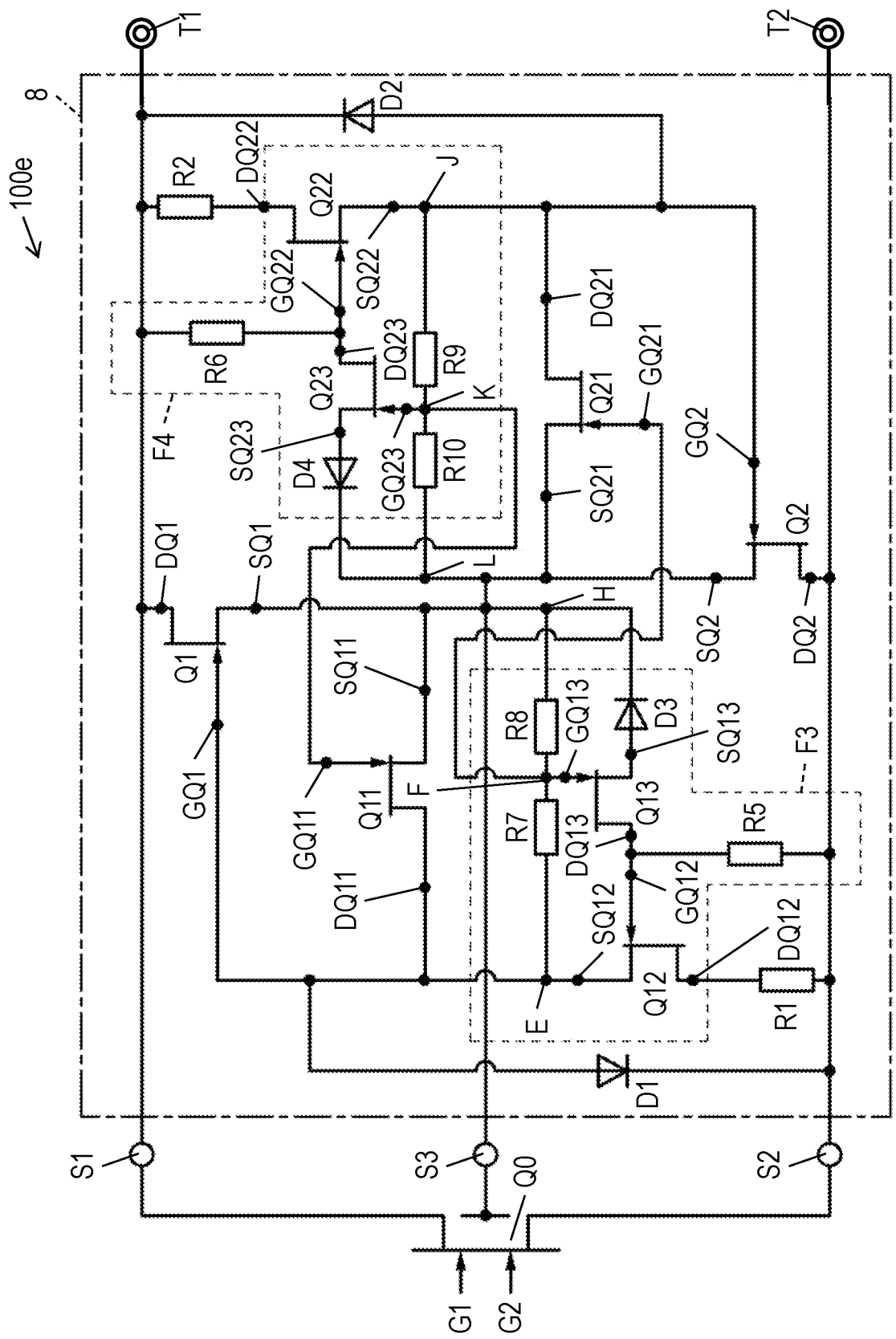
FIG. 11 is a circuit diagram of a bidirectional switch system in accordance with a modification of Embodiment 4.

FIG. 11 is a circuit diagram of still another bidirectional switch system 100e in accordance with Embodiment 4. Bidirectional switch system 100e includes bidirectional switch element Q0 and substrate electric potential stabilization circuit 8. Gate terminal GQ11 of through-current prevention switch Q11 is connected not to gate terminal GQ2 of switch Q2, but to resistor R9, resistor R10, and gate terminal GQ23 of the switch Q23 at node K. In other words, gate terminal GQ23 of switch Q23 is connected to at least resistor R9 and resistor R10 out of resistor R9, resistor R10, and gate terminal GQ11. Gate terminal GQ21 of through-current prevention switch Q21 is connected not to gate terminal GQ1 of switch Q1, but to resistor R7, resistor R8, and gate terminal GQ13 of switch Q13 at node F. In other words, gate terminal GQ13 of switch Q13 is connected to at least resistor R7 and resistor R8 out of resistor R7, resistor R8, and gate terminal GQ21. In bidirectional switch system 100e shown in FIG. 11, gate terminal GQ23 is connected to resistor R9, resistor R10, and gate terminal GQ11 at node K. Gate terminal GQ13 is connected to resistor R7, resistor R8, and gate terminal GQ21 at node F. This configuration stabilizes the voltage applied to gate terminal GQ11 of through-current prevention switch Q11 and the voltage applied to gate terminal GQ21 of through-current prevention switch Q21, similarly to bidirectional switch system 100d. At least one of the gate voltages of through-current prevention switch Q11 and through-current prevention switch Q21 may be stabilized.

Exemplary Embodiment 5

Figure 12:
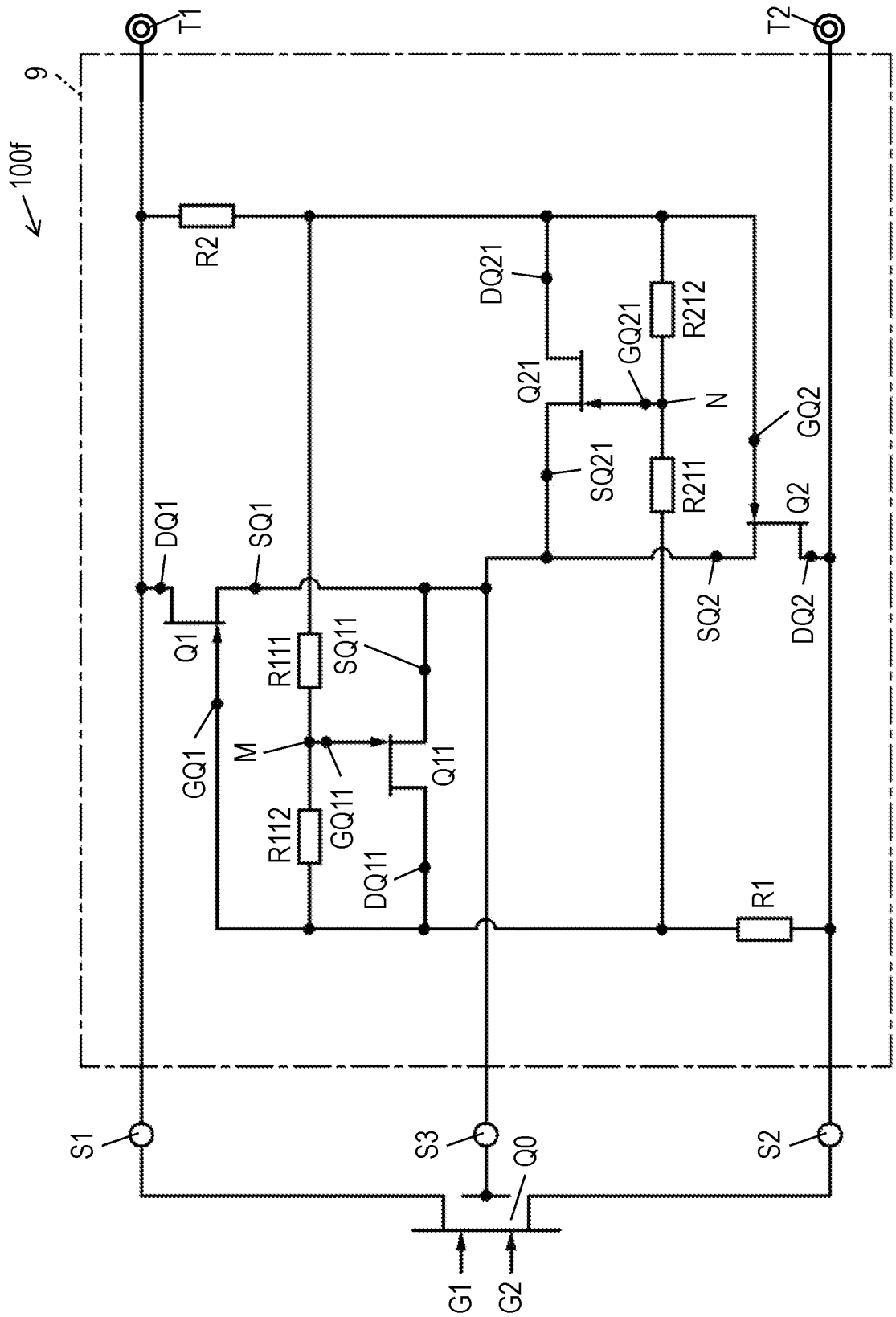
FIG. 12 is a circuit diagram of a bidirectional switch system in accordance with Exemplary Embodiment 5.

FIG. 12 is a circuit diagram of bidirectional switch system 100f in accordance with exemplary Embodiment 5. In FIG. 12, elements identical to those of bidirectional switch system 100 in accordance with Embodiment 1 shown in FIG. 1A are denoted by the same reference numerals. Bidirectional switch system 100f in accordance with Embodiment 5 is different from bidirectional switch system 100 in accordance with Embodiment 1 in voltage dividing resistors R111 and R112 protect switch Q1 and voltage dividing resistors R211 and R212 protect switch Q2. Bidirectional switch system 100f in accordance with Embodiment 5 includes bidirectional switch element Q0 and substrate electric potential stabilization circuit 9. Substrate electric potential stabilization circuit 9 includes resistor R1, resistor R2, switch Q1, switch Q2, through-current prevention circuit 3, and voltage dividing resistors R111, R112, R211, and R212.

Voltage dividing resistor R111 is connected to gate terminal GQ2 of switch Q2 and gate terminal GQ11 of through-current prevention switch Q11 in series between gate terminal GQ2 of switch Q2 and gate terminal GQ11 of through-current prevention switch Q11. Voltage dividing resistor R112 is connected to gate terminal GQ1 of switch Q1 and gate terminal GQ11 of through-current prevention switch Q11 in series between gate terminal GQ1 of switch Q1 and gate terminal GQ11 of through-current prevention switch Q11. Voltage dividing resistor R111 is connected to voltage dividing resistor R112 at node M. Node M is connected to gate terminal GQ11 of through-current prevention switch Q11.

Voltage dividing resistor R211 is connected to gate terminal GQ1 of switch Q1 and gate terminal GQ21 of through-current prevention switch Q21 in series between gate terminal GQ1 of switch Q1 and gate terminal GQ21 of through-current prevention switch Q21. Voltage dividing resistor R212 is connected to gate terminal GQ2 of switch Q2 and gate terminal GQ21 of through-current prevention switch Q21 in series between gate terminal GQ2 of switch Q2 and gate terminal GQ21 of through-current prevention switch Q21. Voltage dividing resistor R211 is connected to voltage dividing resistor R212 at node N. Node N is connected to gate terminal GQ21 of through-current prevention switch Q21. The other circuit configuration is the same as Embodiment 1, and the description thereof is omitted.

An operation of bidirectional switch system 100f will be described below. An operation in which bidirectional switch element Q0 is continuously turned off or is turned off, a voltage is applied to switch Q2 properly, and a voltage is applied to through-current prevention switch Q11 properly is the same as Embodiment 1. For instance, it is assumed that threshold voltages of through-current prevention switch Q11 and through-current prevention switch Q21 are 5V. The resistances of voltage dividing resistors R111 and R112 are determined such that a voltage of 7V is applied to voltage dividing resistor R111 and a voltage of 3V is applied to voltage dividing resistor R112, thereby allowing through-current prevention switch Q11 to be turned on. On the other hand, if resistances of voltage dividing resistors R211 and R212 are determined such that a voltage of 3V is applied to voltage dividing resistor R211 and a voltage of 7V is applied to voltage dividing resistor R212, through-current prevention switch Q21 is turned off.

In the case where the gate voltage of switch Q2 is increased excessively, i.e., an excessively large voltage is applied to gate terminal GQ2 of the switch Q2, if the voltage applied to voltage dividing resistor R211 exceeds the threshold voltage of through-current prevention switch Q21, through-current prevention switch Q21 is turned on. For instance, when a voltage of 6V is applied to voltage dividing resistor R211, through-current prevention switch Q21 is turned on since the above-mentioned voltage exceeds 5V, which is the threshold voltage of through-current prevention switch Q21. This configuration prevents breakage of gate terminal GQ2 of switch Q2.

Gate terminal GQ1 of switch Q1 is protected similarly. Assuming that bidirectional switch element Q0 is continuously turned off or is turned off, if a voltage is applied to switch Q1 properly and a voltage is applied to through-current prevention switch Q21 properly, the operation is the same as Embodiment 1. In the case where a large voltage is applied to gate terminal GQ1 of switch Q1, if a voltage of voltage dividing resistor R111 exceeds the threshold voltage of through-current prevention switch Q11, through-current prevention switch Q11 is turned on, thereby preventing breakage of gate terminal GQ1 of switch Q1.

As described above, voltage dividing resistors R111, R112, R211, and R212 prevent breakage of switch Q1 and switch Q2 which is caused by a high-voltage noise.

SUMMARY

As described above, a substrate electric potential stabilization circuit (1, 5, 6, 7, 8, 9) in accordance with a first aspect is electrically connected to a semiconductor element (Q0) including a main electrode (S1), a main electrode (S2), and a backside electrode (S3). The substrate electric potential stabilization circuit (1, 5, 6, 7, 8, 9) includes a switch (Q1), a switch (Q2), and a through-current prevention circuit (3). The switch (Q1) is connected to the main electrode (S1) and the backside electrode (S3) between the main electrode (S1) and the backside electrode (S3). The switch (Q2) is connected to the main electrode (S2) and the backside electrode (S3) between the main electrode (S2) and the backside electrode (S3). The through-current prevention circuit (3) is configured to prevent the switch (Q1) and the switch (Q2) from being turned on simultaneously.

This configuration prevents a through-current that flows in substrate electric potential stabilization circuit (1, 5, 6, 7, 8, 9) of bidirectional switch system (100).

A substrate electric potential stabilization circuit (1, 5, 6, 7, 8, 9) in accordance with a second aspect includes the switch (Q1), the switch (Q2), and the through-current prevention circuit (3) of the first aspect. The switch (Q1) includes a gate terminal (GQ1). The switch (Q2) includes a gate terminal (GQ2). The through-current prevention circuit (3) includes a resistor (R1), a resistor (R2), a through-current prevention switch (Q11), and a through-current prevention switch (Q21). The resistor (R1) is connected to the gate terminal (GQ1) and the main electrode (S2) between the gate terminal (GQ1) and the main electrode (S2). The resistor (R2) is connected to the gate terminal (GQ2) and the main electrode (S1) between the gate terminal (GQ2) and the main electrode (S1). The through-current prevention switch (Q11) including a gate terminal (GQ11) is connected to the gate terminal (GQ1) and the backside electrode (S3) between the gate terminal (GQ1) and the backside electrode (S3). The through-current prevention switch (Q21) including a gate terminal (GQ21) is connected to the gate terminal (GQ2) and the backside electrode (S3) between the gate terminal (GQ2) and the backside electrode (S3). The gate terminal (GQ1) is connected to the gate terminal (GQ21), and the gate terminal (GQ2) is connected to the gate terminal (GQ11).

According to this configuration, while the switch (Q1) is turned on, a gate terminal and a source terminal of the switch (Q2) are short-circuited by the through-current prevention switch (Q21), thereby preventing the switch (Q1) and the switch (Q2) from being turned on simultaneously. Further, while the switch (Q2) is turned on, a gate terminal and a source terminal of the switch (Q1) are short-circuited by the through-current prevention switch (Q11), thereby preventing the switch (Q1) and the switch (Q2) from being turned on simultaneously. This configuration prevents a through-current that flows in the substrate electric potential stabilization circuit (1, 5, 6, 7, 8) of the bidirectional switch system (100, 100b, 100c, 100d, 100e).

A substrate electric potential stabilization circuit (1, 5, 6, 7) in accordance with a third aspect further includes a resistor (R3), a resistor (R4), a rectifier (D1), and a rectifier (D2) in the second aspect. The resistor (R3) is connected to the gate terminal (GQ1) and the gate terminal (GQ21) between the gate terminal (GQ1) and the gate terminal (GQ21). The resistor (R4) is connected to the gate terminal (GQ2) and the gate terminal (GQ11) between the gate terminal (GQ2) and the gate terminal (GQ11). The rectifier (D1) is connected to the gate terminal (GQ1) and the main electrode (S2) between the gate terminal (GQ1) and the main electrode (S2) while a forward direction of the rectifier (D1) is directed from the gate terminal (GQ1) to the main electrode (S2). The rectifier (D2) is connected to the gate terminal (GQ2) and the main electrode (S1) between the gate terminal (GQ2) and the main electrode (S1) while a forward direction of the rectifier (D2) is directed from the gate terminal (GQ2) to the main electrode (S1).

According to this configuration, when the switch (Q1) is turned off, the switch (Q1) is turned off quickly via the rectifier (D1) while the through-current prevention switch (Q21) is turned off via the resistor (R3). This configuration allows electric charges on the gate terminal (GQ21) to be discharged after the switch (Q1) is discharged. As a result, the switch (Q1) is turned off before the through-current prevention switch (Q21) is turned off, thereby preventing the switch (Q1) and the switch (Q2) from being turned on simultaneously. Similarly, when the switch (Q2) is turned off, the switch (Q2) is turned off quickly via the rectifier (D2) while the through-current prevention switch (Q11) is turned off via the resistor (R4). This configuration allows electric charges on the gate terminal (GQ11) to be discharged after the switch (Q2) is discharged. As a result, the switch (Q2) is turned off before the through-current prevention switch (Q11) is turned off, thereby preventing the switch (Q1) and the switch (Q2) from being turned on simultaneously. When the switch (Q1) is turned on, the switch (Q1) is turned on via the resistor (R1) and the resistor (R3), whereas the through-current prevention switch (Q21) is turned on only via the resistor (R1). Thus, the gate terminal (GQ21) of the through-current prevention switch (Q21) is charged faster than the gate terminal (GQ1) of the switch (Q1). The through-current prevention switch (Q21) is turned on before the switch (Q1) is turned on, thereby preventing the switch (Q1) and the switch (Q2) from being turned on simultaneously. The switch (Q2) is turned on in the same manner. The switch (Q2) is turned on via the resistor (R2) and the resistor (R4), whereas through-current prevention switch (Q11) is turned on only via the resistor (R2). Thus, the gate terminal (GQ11) of the through-current prevention switch (Q11) is charged faster than the gate terminal (GQ2) of the switch (Q2). The through-current prevention switch (Q11) is turned on before the switch (Q2) is turned on, thereby preventing the switch (Q1) and the switch (Q2) from being turned on simultaneously.

A substrate electric potential stabilization circuit (6) of a fourth aspect further includes a control voltage stabilization circuit (F1) and a control voltage stabilization circuit (F2) in the second or third aspect. The control voltage stabilization circuit (F1) includes a switch (Q12), a resistor (R5), and a Zener diode (ZD1). The control voltage stabilization circuit (F2) includes a switch (Q22), a resistor (R6), and a Zener diode (ZD2). In control voltage stabilization circuit (F1), the resistor (R1) is connected to the gate terminal (GQ1) of the switch (Q1) via the switch (Q12), and the gate terminal (GQ12) of the switch (Q12) is connected to a cathode of the Zener diode (ZD1). In control voltage stabilization circuit (F1), the backside electrode (S3) is connected to an anode of the Zener diode (ZD1), and the gate terminal (GQ12) of switch (Q12) is connected to the main electrode (S2) via the resistor (R5). In control voltage stabilization circuit (F2), the resistor (R2) is connected to the gate terminal (GQ2) of the switch (Q2) via the switch (Q22), and the gate terminal (GQ22) of the switch (Q22) is connected to a cathode of the Zener diode (ZD2). In control voltage stabilization circuit (F2), the backside electrode (S3) is connected to an anode of the Zener diode (ZD2), and the gate terminal (GQ22) of switch (Q22) is connected to the main electrode (S1) via the resistor (R6).

According to this configuration, control voltage stabilization circuit (F1) stabilizes the voltage between the resistor (R1) and the switch (Q1). Control voltage stabilization circuit (F2) stabilizes the voltage between the resistor (R2) and the switch (Q2). Stabilizing the voltages improves tolerance of the switch (Q1) and the switch (Q2) to a high-voltage noise.

A substrate electric potential stabilization circuit (7, 8) of a fifth aspect further includes a control voltage stabilization circuit (F3) and a control voltage stabilization circuit (F4) in the second or third aspect. The control voltage stabilization circuit (F3) includes a switch (Q12), a switch (Q13), a resistor (R7), a resistor (R8), and a rectifier (D3). The control voltage stabilization circuit (F4) includes a switch (Q22), a switch (Q23), a resistor (R9), a resistor (R10), and a rectifier (D4). In the control voltage stabilization circuit (F3), the resistor (R7) and the resistor (R8) are connected in series to each other between the gate terminal (GQ1) of the switch (Q1) and the backside electrode (S3). The backside electrode (S3) is connected to a cathode of the rectifier (D3). In the control voltage stabilization circuit (F3), the switch (Q13) is connected between an anode of the rectifier (D3) and the resistor (R5). The gate terminal of the switch (Q13) is connected to the resistor (R7) and the resistor (R8). The resistor (R5) is connected to the gate terminal of the switch (Q12) and the main electrode (S2) between the gate of the switch (Q12) and the main electrode (S2). In the control voltage stabilization circuit (F4), the resistor (R9) and the resistor (R10) are connected in series to each other between the gate terminal (GQ2) of the switch (Q2) and the backside electrode (S3). The backside electrode (S3) is connected to a cathode of the rectifier (D4). In the control voltage stabilization circuit (F4), the switch (Q23) is connected between an anode of the rectifier (D4) and the resistor (R6). The gate terminal of the switch (Q23) is connected to the resistor (R9) and the resistor (R10). The resistor (R6) is connected to the gate terminal of the switch (Q22) and the main electrode (Si) between the gate of the switch (Q22) and the main electrode (S1).

According to this configuration, the control voltage stabilization circuit (F1) stabilizes the voltage between the resistor (R1) and the switch (Q1). The control voltage stabilization circuit (F2) stabilizes the voltage between the resistor (R2) and the switch (Q2). Stabilizing the voltages improves tolerance of the switch (Q1) and the switch (Q2) to a high-voltage noise. Further, this circuit is a circuit configuration achieved by a monolithic circuit.

In the substrate electric potential stabilization circuit (1, 5, 6, 7, 8, 9) of a sixth aspect, the semiconductor element is a dual-gate bidirectional switch element (Q0) in any of the first to fifth aspects.

This configuration provides the bidirectional switch element (Q0) with excellent voltage resistance and electrical properties stability.

In the substrate electric potential stabilization circuit (1, 5, 6, 7, 8, 9) of a seventh aspect, the switch (Q1), the switch (Q2), the switch (Q12), the switch (Q22), the switch (Q13), the switch (Q23), the through-current prevention switch (Q11), and the through-current prevention switch (Q21) are implemented by transistors in the fifth aspect. Each transistor includes a drain terminal connected to an ohmic electrode with no rectifying property, a source terminal connected to the backside electrode (S3), and a gate terminal which is a control terminal.

According to this configuration, highly precise control can be achieved by the transistor. Further, the transistor is combined with the bidirectional switch element (Q0) to constitute a monolithic circuit.

In the substrate electric potential stabilization circuit (1, 5, 6, 7, 8, 9) of an eighth aspect, the switch (Q1), the switch (Q2), the switch (Q12), the switch (Q22), the switch (Q13), the switch (Q23), the through-current prevention switch (Q11), and the through-current prevention switch (Q21) are implemented by gallium-nitride-based semiconductor elements in the seventh aspect.

According to this configuration, material of the gallium-nitride-based semiconductor elements provides a miniaturized and high-speed semiconductor element with high voltage resistance and high heat resistance, as compared with the conventional silicon. The gallium-nitride-based semiconductor element constituting the circuit provides the same effects.

In the substrate electric potential stabilization circuit (1, 5, 6, 7, 8, 9) of a ninth aspect, the semiconductor element (Q0), the switch (Q1), the switch (Q2), the switch (Q12), the switch (Q22), the switch (Q13), the switch (Q23), the through-current prevention switch (Q11), and the through-current prevention switch (Q21) are formed on the same chip as a monolithic circuit in the eighth aspect. The semiconductor element (Q0) includes the main electrode (S1), the main electrode (S2), and the backside electrode (S3).

According to this configuration, the miniaturization is achieved easily. This makes it easy to increase a degree of integration, advantageously.

In the substrate electric potential stabilization circuit (1, 5, 6, 7, 8, 9) of a tenth aspect, the semiconductor element (Q0) is a gallium-nitride-based semiconductor element in any of the first to ninth aspects.

According to this configuration, a material of the gallium-nitride-based semiconductor element is used for achieving a miniaturized and high-speed semiconductor element with high voltage resistance and high heat resistance, as compared with the conventional silicon. When the gallium-nitride-based semiconductor element is used to constitute the circuit, the same effects can be expected.

A bidirectional switch system (100,100b, 100c, 100d, 100e, 100f) of an eleventh aspect includes the substrate electric potential stabilization circuit (1, 5, 6, 7, 8, 9) according to any of the first to tenth aspects, and the semiconductor element (Q0).

According to this configuration, the bidirectional switch system (100,100b, 100c, 100d, 100e, 100f) suppresses a through-current that flows in the substrate electric potential stabilization circuit (1, 5, 6, 7, 8, 9), thereby providing a system with high noise immunity.

REFERENCE MARKS IN THE DRAWINGS 1, 5, 6, 7, 8, 9 substrate electric potential stabilization circuit
2 main bidirectional switch
3 through-current prevention circuit
F node (first node)
K node (second node)
Q0 semiconductor element
Q1 switch (first switch)
Q11 through-current prevention switch (first through-current prevention switch)
Q2 switch (second switch)
Q21 through-current prevention switch (second through-current prevention switch)
Q12 switch (third switch)
Q22 switch (fourth switch)
Q13 switch (fifth switch)
Q23 switch (sixth switch)
R1 resistor (first resistor)
R2 resistor (second resistor)
R3 resistor (third resistor)
R4 resistor (fourth resistor)
R5 resistor (fifth resistor)
R6 resistor (sixth resistor)
R7 resistor (seventh resistor)
R8 resistor (eighth resistor)
R9 resistor (ninth resistor)
R10 resistor (tenth resistor)
D1 rectifier (first rectifier)
D2 rectifier (second rectifier)
D3 rectifier (third rectifier)
D4 rectifier (fourth rectifier)
ZD1 Zener diode (first Zener diode)
ZD2 Zener diode (second Zener diode)
100,100b, 100c, 100d, 100e, 100f bidirectional switch system
GQ1 gate terminal (first control terminal)
GQ2 gate terminal (second control terminal)
GQ11 gate terminal (third control terminal)
GQ21 gate terminal (fourth control terminal)
F1 control voltage stabilization circuit (first control voltage stabilization circuit)
F2 control voltage stabilization circuit (second control voltage stabilization circuit)
F3 control voltage stabilization circuit (first control voltage stabilization circuit)
F4 control voltage stabilization circuit (second control voltage stabilization circuit)

The invention claimed is:

1. A substrate electric potential stabilization circuit configured to be connected to a bidirectional switch element, the bidirectional switch element including a semiconductor substrate, a first main electrode connected to the semiconductor substrate, a second main electrode connected to the semiconductor substrate, and a backside electrode connected to the semiconductor substrate, the substrate electric potential stabilization circuit comprising:
- a first switch connected to the first main electrode and the backside electrode in series between the first main electrode and the backside electrode;
- a second switch connected to the second main electrode and the backside electrode in series between the second main electrode and the backside electrode; and
- a through-current prevention circuit configured to prevent the first switch and the second switch from being turned on simultaneously.

2. The substrate electric potential stabilization circuit according to claim 1, wherein
the first switch includes a first control terminal configured to control turning on and off of the first switch,
the second switch includes a second control terminal configured to control turning on and off of the second switch, and
the through-current prevention circuit includes:
- a first resistor connected to the second main electrode in series between the first control terminal of the first switch and the second main electrode;
- a second resistor connected to the first main electrode in series between the second control terminal of the second switch and the first main electrode;
- a first through-current prevention switch connected in series between the backside electrode and the first control terminal of the first switch; and
- a second through-current prevention switch connected in series between the backside electrode and the second control terminal of the second switch, the first through-current prevention switch includes a third control terminal configured to control turning on and off of the first through-current prevention switch,
the second through-current prevention switch includes a fourth control terminal configured to control turning on and off of the second through-current prevention switch,
the first control terminal of the first switch is electrically connected to the fourth control terminal of the second through-current prevention switch, and
the second control terminal of the second switch is electrically connected to the third control terminal of the first through-current prevention switch.

3. The substrate electric potential stabilization circuit according to claim 2, wherein the through-current prevention circuit further includes:
- a third resistor connected to the first control terminal and the fourth control terminal in series between the first control terminal and the fourth control terminal;
- a fourth resistor connected to the second control terminal and the third control terminal in series between the second control terminal and the third control terminal;
- a first rectifier connected to the first control terminal and the second main electrode in series between the first control terminal and the second main electrode, a forward direction of the first rectifier being directed from the first control terminal to the second main electrode; and
- a second rectifier connected to the second control terminal and the first main electrode in series between the second control terminal and the first main electrode, a forward direction of the second rectifier being directed from the second control terminal to the first main electrode.

4. The substrate electric potential stabilization circuit according to claim 2, further comprising:
- a first control voltage stabilization circuit including a third switch, a fifth resistor, and a first Zener diode; and
- a second control voltage stabilization circuit including a fourth switch, a sixth resistor, and a second Zener diode, wherein the first resistor is connected to the first control terminal of the first switch via the third switch,
the third switch includes a control terminal configured to control turning on and off of the third switch,
the control terminal of the third switch is connected to a cathode of the first Zener diode,
an anode of the first Zener diode is connected to the backside electrode,
the control terminal of the third switch is connected to the second main electrode via the fifth resistor,
the second resistor is connected to the second control terminal of the second switch via the fourth switch,
the fourth switch includes a control terminal configured to control turning on and off of the fourth switch,
the control terminal of the fourth switch is connected to a cathode of the second Zener diode,
an anode of the second Zener diode is connected to the backside electrode, and
the control terminal of the fourth switch is connected to the first main electrode via the sixth resistor.

5. The substrate electric potential stabilization circuit according to claim 2, further comprising:
- a first control voltage stabilization circuit including a third switch, a fifth switch, a fifth resistor, a seventh resistor, an eighth resistor, and a third rectifier; and
- a second control voltage stabilization circuit including a fourth switch, a sixth switch, a sixth resistor, a ninth resistor, a tenth resistor, and a fourth rectifier, wherein the seventh resistor is connected to the first control terminal of the first switch and a first node in series between the first control terminal of the first switch and the first node,
the eighth resistor is connected to the first node and the backside electrode a first node between the first node and the backside electrode,
a cathode of the third rectifier is connected to the backside electrode,
the fifth switch is connected to an anode of the third rectifier and the fifth resistor a first node between the anode of the third rectifier and the fifth resistor,
the fifth switch includes a control terminal configured to control turning on and off of the fifth switch,
the control terminal of the fifth switch is connected to the first node,
the third switch includes a control terminal configured to control turning on and off of the third switch,
the fifth resistor is connected to the control terminal of the third switch and the second main electrode in series between the control terminal of the third switch and the second main electrode,
the ninth resistor is connected to the second control terminal of the second switch and a second node between the second control terminal of the second switch and the second node,
the tenth resistor is connected to the second node and the backside electrode in series between the second node and the backside electrode, a cathode of the fourth rectifier is connected to the backside electrode, the sixth switch is connected to an anode of the fourth rectifier and the sixth resistor in series between the anode of the fourth rectifier and the sixth resistor, the sixth switch includes the control terminal configured to control turning on and off of the sixth switch, the control terminal of the sixth switch is connected to the second node, the fourth switch includes a control terminal configured to control turning on and off of the fourth switch, the sixth resistor is connected to the control terminal of the fourth switch and the first main electrode in series between the control terminal of the fourth switch and the first main electrode.

6. The substrate electric potential stabilization circuit according to claim 5, wherein the fourth control terminal of the second through-current prevention switch is connected to the first control terminal, and the third control terminal of the first through-current prevention switch is connected to the second control terminal.

7. The substrate electric potential stabilization circuit according to claim 5, wherein the fourth control terminal of the second through-current prevention switch is connected to the first node, and the third control terminal of the first through-current prevention switch is connected to the second node.

8. The substrate electric potential stabilization circuit according to claim 5, wherein each the first switch, the second switch, the third switch, the fourth switch, the fifth switch, the sixth switch, the first through-current prevention switch, and the second through-current prevention switch is a transistor including a gate terminal, a source terminal electrically connected to the backside electrode, and a drain terminal electrically connected to an ohmic electrode having no rectifying property.

9. The substrate electric potential stabilization circuit according to claim 8, wherein each of the first switch, the second switch, the third switch, the fourth switch, the fifth switch, the sixth switch, the first through-current prevention switch, and the second through-current prevention switch is a gallium-nitride-based semiconductor element.

10. The substrate electric potential stabilization circuit according to claim 9, wherein the bidirectional switch element, the first switch, the second switch, the third switch, the fourth switch, the fifth switch, the sixth switch, the first through-current prevention switch, and the second through-current prevention switch are provided on a chip as a monolithic circuit.

11. The substrate electric potential stabilization circuit according to claim 1, wherein the bidirectional switch element is a dual-gate bidirectional switch element.

12. The substrate electric potential stabilization circuit according to claim 1, wherein the bidirectional switch element is a gallium-nitride-based semiconductor element.

13. A bidirectional switch system comprising:
the substrate electric potential stabilization circuit according to claim 1; and
the bidirectional switch element.

* * * * *